United States Patent
Kang et al.

(10) Patent No.: US 11,867,747 B2
(45) Date of Patent: Jan. 9, 2024

(54) TRANSFER APPARATUS FOR INSPECTION APPARATUS, INSPECTION APPARATUS, AND OBJECT INSPECTION METHOD USING SAME

(71) Applicant: KOH YOUNG TECHNOLOGY INC., Seoul (KR)

(72) Inventors: Myong Kang, Gunpo-si Gyeonggi-do (KR); Kang Jo Hwang, Seoul (KR); Choung Min Jung, Siheung-si Gyeonggi-do (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 206 days.

(21) Appl. No.: 17/425,511

(22) PCT Filed: Jan. 22, 2020

(86) PCT No.: PCT/KR2020/001074
§ 371 (c)(1),
(2) Date: Jul. 23, 2021

(87) PCT Pub. No.: WO2020/153742
PCT Pub. Date: Jul. 30, 2020

(65) Prior Publication Data
US 2022/0091180 A1    Mar. 24, 2022

(30) Foreign Application Priority Data
Jan. 24, 2019 (KR) .......................... 10-2019-0009391

(51) Int. Cl.
*G01R 31/02* (2006.01)
*G01R 31/304* (2006.01)
(Continued)

(52) U.S. Cl.
CPC ................................ *G01R 31/2808* (2013.01)

(58) Field of Classification Search
CPC ................ G01R 31/28; G01R 31/2808; G01R 31/2867; G01R 31/2887; G01R 31/2893;
(Continued)

(56) References Cited

U.S. PATENT DOCUMENTS

| 6,362,877 B1 | 3/2002 | Kobayashi et al. |
| 2004/0016136 A1 | 1/2004 | Igarashi et al. |

(Continued)

FOREIGN PATENT DOCUMENTS

| CN | 1121368 | 4/1996 |
| CN | 1460834 | 12/2003 |

(Continued)

OTHER PUBLICATIONS

Japanese Office Action, with English translation, corresponding to Japanese Patent Application No. 2021-543257 dated Aug. 4, 2022.
(Continued)

*Primary Examiner* — Neel D Shah
(74) *Attorney, Agent, or Firm* — KILE PARK REED & HOUTTEMAN PLLC

(57) ABSTRACT

A transfer apparatus for an inspection apparatus according to one embodiment of the present disclosure includes: an upper end engaging portion configured to make contact with an upper surface of a transferred article; a support frame to which the upper end engaging portion is fixed; a lift including a support part configured to support a lower surface of the transferred article, the lift arranged on the support frame to be movable in an up-down direction; and a lifting driver configured to provide a driving force to move the lift in the up-down direction.

18 Claims, 21 Drawing Sheets

(51) Int. Cl.
  *G01R 1/02*    (2006.01)
  *G01R 1/04*    (2006.01)
  *G01R 1/067*   (2006.01)
  *G01R 1/073*   (2006.01)
  *G01R 31/28*   (2006.01)

(58) Field of Classification Search
  CPC .... G01R 31/2813; G01R 31/304; G01R 1/02; G01R 1/04; G01R 1/067; G01R 1/073
  See application file for complete search history.

(56) References Cited

U.S. PATENT DOCUMENTS

| | | |
|---|---|---|
| 2005/0129469 A1 | 6/2005 | Ikehata et al. |
| 2006/0290369 A1 | 12/2006 | Yamashita et al. |
| 2008/0265479 A1 | 10/2008 | Chen et al. |
| 2010/0201386 A1 | 8/2010 | Roelvink |
| 2012/0192616 A1 | 8/2012 | Wang et al. |
| 2013/0048466 A1* | 2/2013 | Tsunoi ............... H01L 21/67706 198/346.2 |
| 2013/0113494 A1 | 5/2013 | Nishihara et al. |
| 2015/0086303 A1 | 3/2015 | Nakagawa et al. |
| 2016/0163576 A1 | 6/2016 | Nakagawa et al. |
| 2016/0278217 A1 | 9/2016 | Tanaka et al. |
| 2017/0106391 A1 | 4/2017 | Han |
| 2018/0148282 A1 | 5/2018 | Ikeda |
| 2018/0297784 A1 | 10/2018 | Park et al. |
| 2018/0368296 A1 | 12/2018 | Fujishiro et al. |
| 2019/0135562 A1 | 5/2019 | Ikeda |
| 2020/0115175 A1 | 4/2020 | Ikeda |

FOREIGN PATENT DOCUMENTS

| | | | | |
|---|---|---|---|---|
| CN | 1629061 | 6/2005 | | |
| CN | 101144920 | 3/2008 | | |
| CN | 201672910 | 12/2010 | | |
| CN | 202066796 | 12/2011 | | |
| CN | 102963725 | 3/2013 | | |
| CN | 103038932 | 4/2013 | | |
| CN | 104459425 | 3/2015 | | |
| CN | 104505485 | 4/2015 | | |
| CN | 105752635 | 7/2016 | | |
| CN | 205384112 | 7/2016 | | |
| CN | 107738919 | 2/2018 | | |
| CN | 107926150 | 4/2018 | | |
| CN | 207293648 | 5/2018 | | |
| CN | 207335610 | 5/2018 | | |
| CN | 108663011 | 10/2018 | | |
| CN | 108698767 | 10/2018 | | |
| CN | 208091375 | 11/2018 | | |
| CN | 109202778 | 1/2019 | | |
| IN | 106443041 | 2/2017 | | |
| JP | 6-107296 | 4/1993 | | |
| JP | 10-221058 | 8/1998 | | |
| JP | 2000-338164 | 12/2000 | | |
| JP | 2001-44693 | 2/2001 | | |
| JP | 2004-186681 | 7/2004 | | |
| JP | 3691146 | 6/2005 | | |
| JP | 2006-138808 | 6/2006 | | |
| JP | 2007-311497 | 11/2007 | | |
| JP | 2011-60981 | 3/2011 | | |
| JP | 2013-51333 | 3/2013 | | |
| JP | 2017-207329 | 11/2017 | | |
| JP | 2017207329 | * 11/2017 | ............. | G03B 21/00 |
| JP | 2018-159695 | 10/2018 | | |
| JP | 2018-531200 | 10/2018 | | |
| KR | 10-0582695 | 5/2006 | | |
| KR | 20-0420972 | 7/2006 | | |
| KR | 10-2009-0088736 | 8/2009 | | |
| KR | 10-2013-0031789 | 3/2013 | | |
| KR | 10-2014-0097648 | 8/2014 | | |
| KR | 10-1557783 | 10/2015 | | |
| KR | 10-1614706 | 4/2016 | | |
| KR | 10-2016-0048549 | 5/2016 | | |
| KR | 10-1682012 | 12/2016 | | |
| KR | 10-2017-0050580 | 5/2017 | | |
| KR | 10-1743479 | 6/2017 | | |

OTHER PUBLICATIONS

Japanese Office Action, with English translation, corresponding to Japanese Patent Application No. 2021-543254 dated Aug. 23, 2022.
Extended European Search Report, corresponding to European Application No./ Patent No. 20744756.6, dated Feb. 18, 2022.
Extended European Search Report, corresponding to European Application No./ Patent No. 20744658.4, dated Feb. 18, 2022.
Non-Final Office Action from US Patent Office for U.S. Appl. No. 17/425,497, dated Apr. 17, 2023.
Chinese Office Action with English translation for Chinese Patent Application or Patent No. 202080010629.8, dated Jan. 20, 2023.
Chinese Office Action with English translation for Chinese Patent Application or Patent No. 202080010637.2, dated Jan. 20, 2023.
International Search Report with English translation for International Application No. PCT/KR2020/001074, dated May 26, 2020.
International Search Report with English translation for International Application No. PCT/KR2020/001073, dated May 1, 2020.
Written Opinion with English translation for International Application No. PCT/KR2020/001073, dated May 4, 2020.
Written Opinion with English translation for International Application No. PCT/KR2020/001074, dated May 26, 2020.
Korean Office Action with English translation for Korean Patent Application No. 10-2021-7023517, dated Jun. 20, 2023.
Korean Office Action with English translation for Korean Patent Application No. 10-2021-7023518, dated Jun. 21, 2023.
Korean Office Action with English translation for Korean Patent Application No. 10-2021-7023518, dated Jul. 19, 2023.

* cited by examiner

TRANSFER APPARATUS FOR INSPECTION APPARATUS, INSPECTION APPARATUS, AND OBJECT INSPECTION METHOD USING SAME

CROSS REFERENCE TO RELATED APPLICATIONS

The application is a national entry of International Application No. PCT/KR2020/001074, filed on Jan. 22, 2020, which claims under 35 U.S.C. § 119(a) and 365(b) priority to and benefits of Korean Patent Application No. 10-2019-0009391, filed on Jan. 24, 2019 in the Korean Intellectual Property Office, the entire contents of which are incorporated herein by reference.

TECHNICAL FIELD

The present disclosure relates to a transfer apparatus for an inspection apparatus, an inspection apparatus, and an object inspection method using same.

BACKGROUND

In the case of manufacturing and distributing various products as they are or assembling them with other products, the process of performing an inspection on the manufactured state or the assembled state of the products (objects) is an essential process in order to increase the reliability of the products. Conventional product inspections have been visually performed. In recent years, a technique for improving inspection accuracy and increasing a work speed through the use of an inspection apparatus has been developed.

The type, shape and size of objects may be different. For example, a substrate such as a printed circuit board (PCB) or the like may be an object. A plurality of elements may be disposed on the substrate. A pin insertion apparatus may insert a plurality of pins into a plurality of holes formed on the substrate. Through the inserted pins, the substrate may be electrically connected to other components.

SUMMARY

Embodiments of the present disclosure provide an apparatus and method for efficiently inspecting an object.

Embodiments of the present disclosure provide an apparatus and method for helping to accurately perform an inspection in a state in which an object is located at a predetermined accurate position.

In the related art, an object inspection apparatus in which an object is manually replaced has a problem in that the safety of an operator is low. For example, a jig is placed on and transferred by a ball screw driven by a servomotor. Thus, there is a risk of fatal injury to the operator if the operator accidentally bumps his or her hand against the jig during the movement of the jig. Embodiments of the present disclosure solve the problem of the related art mentioned above.

One aspect of the present disclosure provides embodiments of a transfer apparatus for an inspection apparatus. A transfer apparatus according to a representative embodiment includes: an upper end engaging portion configured to make contact with an upper surface of a transferred article including an inspection object; a support frame to which the upper end engaging portion is fixed; a lift including a support part configured to support a lower surface of the transferred article, the lift arranged on the support frame to be movable in an up-down direction; and a lifting driver configured to provide a driving force to move the lift in the up-down direction.

In some embodiments, the support part may be configured to move the transferred article in a front-rear direction while supporting the lower surface of the transferred article.

In some embodiments, the lift may include a transfer pulley and a motor configured to provide a driving force for rotating the transfer pulley, and the support part may include a transfer belt wound around the transfer pulley to be rotatable and configured to support the lower surface of the transferred article.

In some embodiments, the lift may include a rear end stopper configured to make contact with a rear surface of the transferred article to set a maximum rearward movement position of the transferred article.

In some embodiments, the transfer apparatus may further include: a mover arranged in front of the support part and configured to move the transferred article in a rear direction while supporting the transferred article, wherein the mover may be configured to move the transferred article in the rear direction so that the support part supports the transferred article.

In some embodiments, the support part may be configured to move the transferred article in a front direction so that the mover supports the transferred article.

In some embodiments, the transfer apparatus may further include: a first mover arranged in front of the support part and configured to move the transferred article in a rear direction while supporting the transferred article; and a second mover arranged above or below the first mover and in front of the support part and configured to move the transferred article in a front direction while supporting the transferred article, wherein the first mover may be configured to move the transferred article in the rear direction so that the support part supports the transferred article, and the support part may be configured to move the transferred article in the front direction so that the second mover supports the transferred article.

In some embodiments, the transfer apparatus may further include: a variable stopper configured to move in a stopping direction perpendicular to the up-down direction and the front-rear direction to make contact with a lower surface of the lift when the lift moves downward and configured to move in a releasing direction opposite to the stopping direction so as not to stop the lift when the lift moves downward, wherein the variable stopper may be configured such that, when the lower surface of the lift is in contact with the variable stopper, an upper surface of an upper one of the first mover and the second mover is located at the same height as an upper surface of the support part.

In some embodiments, the upper surface of the transferred article may come into contact with the upper end engaging portion when the lift is moved upward, and the upper surface of the transferred article may be spaced apart from the upper end engaging portion when the lift is moved downward.

In some embodiments, the lift may include a side guide configured to make contact with a left surface or a right surface of the transferred article.

In some embodiments, the upper end engaging portion may be configured to make contact with an upper surface of one side portion, which is one of a left side portion and a right side portion of the transferred article. The support part may be configured to support a lower surface of the one side portion. The side guide may be configured to make contact with an end of the transferred article on a side on which the one side portion is disposed with respect to a center of the transferred article.

In some embodiments, the upper end engaging portion may include a plurality of lower surfaces arranged to form a plurality of gaps in a front-rear direction and configured to make contact with the upper surface of the transferred article, and the side guide may include a plurality of side guide protrusions protruding upward to be inserted into the plurality of gaps and configured to make contact with a left surface or a right surface of the transferred article.

In some embodiments, the upper end engaging portion may include a plurality of upper end engaging protrusions protruding in a direction in which the side guide faces the transferred article and forming the plurality of lower surfaces.

In some embodiments, the transfer apparatus may further include a lower end stopper configured to make contact with a lower surface of the lift to set a maximum downward movement position of the lift.

In some embodiments, the transfer apparatus may further include a plurality of lifting sensors fixed to the support frame to detect a plurality of set positions of the lift. The lift may include a lifting target detected by one of the plurality of lifting sensors when the lift is located at one of the plurality of set positions.

Another aspect of the present disclosure provides embodiments of an inspection apparatus including at least one transfer apparatus recited above.

In some embodiments, the at least one transfer apparatus may include a first transfer apparatus configured to support a left side portion of the transferred article, and a second transfer apparatus configured to support a right side portion of the transferred article.

In some embodiments, the inspection apparatus may further include: a frame guide configured to guide left-right movement of at least one of the first transfer apparatus and the second transfer apparatus; and a driver configured to provide a driving force for moving the at least one of the first transfer apparatus and the second transfer apparatus in a left-right direction.

A further aspect of the present disclosure provides embodiments of an object inspection method using an inspection apparatus including the transfer apparatus recited above. An object inspection method according to a representative embodiment includes: moving the transferred article upward by moving the lift upward and contacting the upper surface of the transferred article with the upper end engaging portion; inspecting the inspection object to determine whether the inspection object is defective; and moving the transferred article downward by moving the lift downward and spacing apart the upper surface of the transferred article from the upper end engaging portion.

In some embodiments, the method may further include: moving the transferred article in a rear direction by the moving the transferred article upward; and moving the transferred article in a front direction by the support part after the moving the transferred article downward.

According to the embodiments of the present disclosure, it is possible to efficiently and accurately inspect an object.

According to the embodiments of the present disclosure, the reliability of an inspection can be improved by allowing the inspection to be performed in a state in which an object is precisely located at a predetermined position.

According to the embodiments of the present disclosure, it is possible to conveniently set the inspection distance of an object to an image sensor.

According to the embodiments of the present disclosure, a jig is transferred on a transfer belt (e.g., a conveyor belt). Therefore, even if an operator accidentally bumps into the jig, a slip is generated between the jig and the transfer belt, which makes it possible to prevent occurrence of a safety accident.

DETAILED DESCRIPTION

Figure 1:
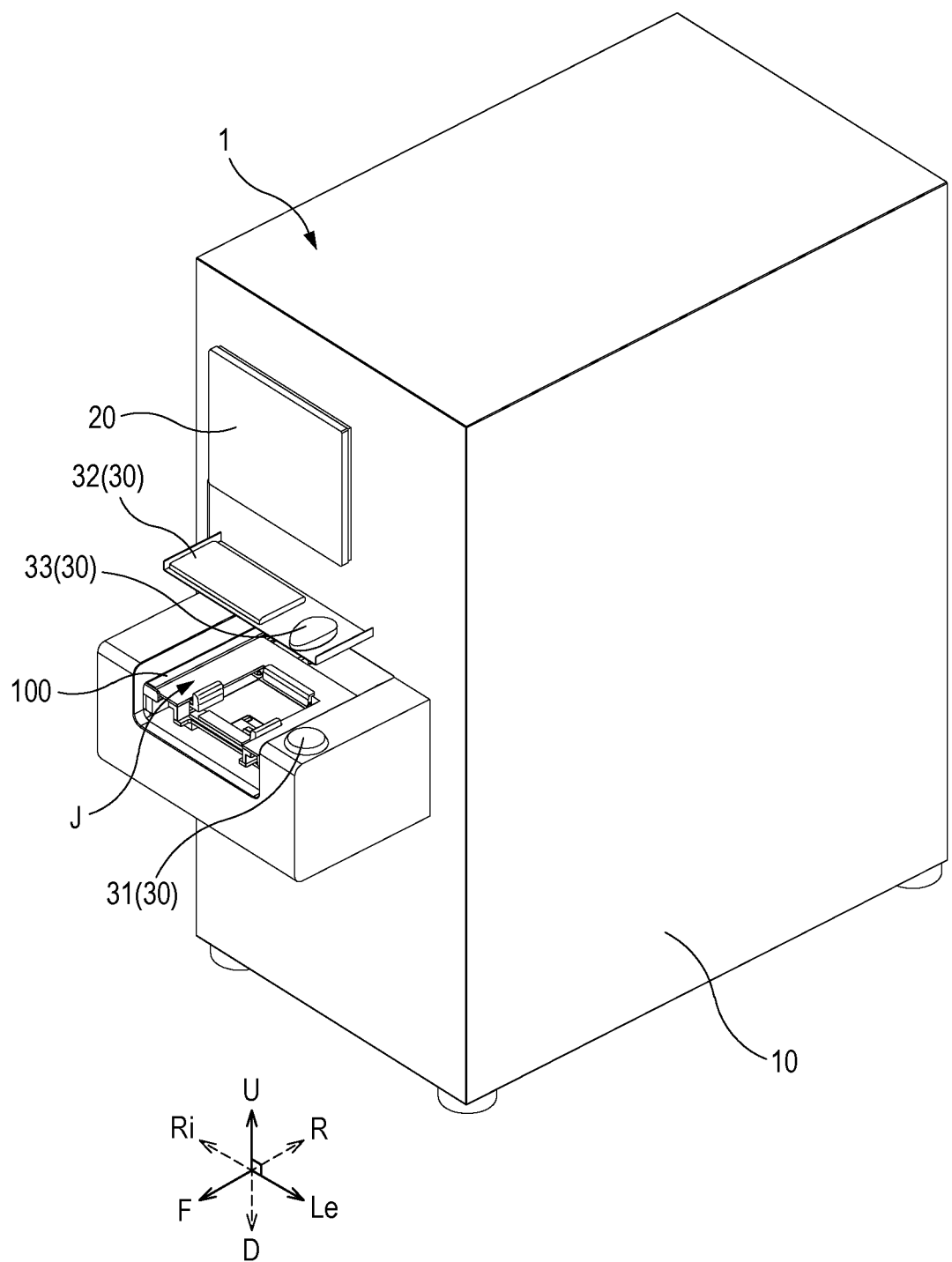
FIG. 1 is a perspective view of an inspection apparatus 1 according to a first embodiment of the present disclosure.

Embodiments of the present disclosure are illustrated for the purpose of explaining the technical idea of the present disclosure. The scope of the rights according to the present disclosure is not limited to the embodiments presented below or the detailed descriptions of such embodiments.

All technical and scientific terms used in the present disclosure have the meaning generally understood by those of ordinary skill in the art to which the present disclosure pertains, unless otherwise defined. All terms used in the present disclosure are chosen for the purpose of more clearly describing the present disclosure and are not chosen to limit the scope of rights according to the present disclosure.

As used in the present disclosure, expressions such as "comprising", "including", "having", and the like are to be understood as open-ended terms having the possibility of encompassing other embodiments, unless otherwise mentioned in the phrase or sentence containing such expressions.

The singular form described in the present disclosure may include a plural meaning, unless otherwise mentioned. This applies equally to the singular form recited in the claims.

The terms "first", "second", etc. used herein are used to identify a plurality of components from one another, and are not intended to limit the order or importance of the relevant components.

The expression "based on" used herein is used to describe one or more factors that influences a decision, an action of judgment or an operation described in a phrase or sentence including the relevant expression, and this expression does not exclude additional factor influencing the decision, the action of judgment or the operation.

In the present disclosure, where it is mentioned in the present disclosure that one element is "connected" to another element, it is to be understood that said one element may be directly connected to another element, or may be connected to another element via a new additional element.

The expressions indicating directions such as "front (F)", "rear (R)", "left (Le)", "right (Ri)", "up (U)", "down (D)" and the like used in the present disclosure, are defined as indicated in the drawings. The expressions for the respective directions are used to make explanation so that the present disclosure can be clearly understood. The directions may be defined differently depending on what is the reference.

Hereinafter, descriptions are made as to embodiments of the present disclosure with reference to the accompanying drawings. In the accompanying drawings, the same or corresponding elements are denoted by the same reference numerals. In the following descriptions of the embodiments, descriptions of the same or corresponding elements may be omitted. However, even if the descriptions of elements are omitted, it is not intended that such elements are not included in a certain embodiment.

Figure 2:
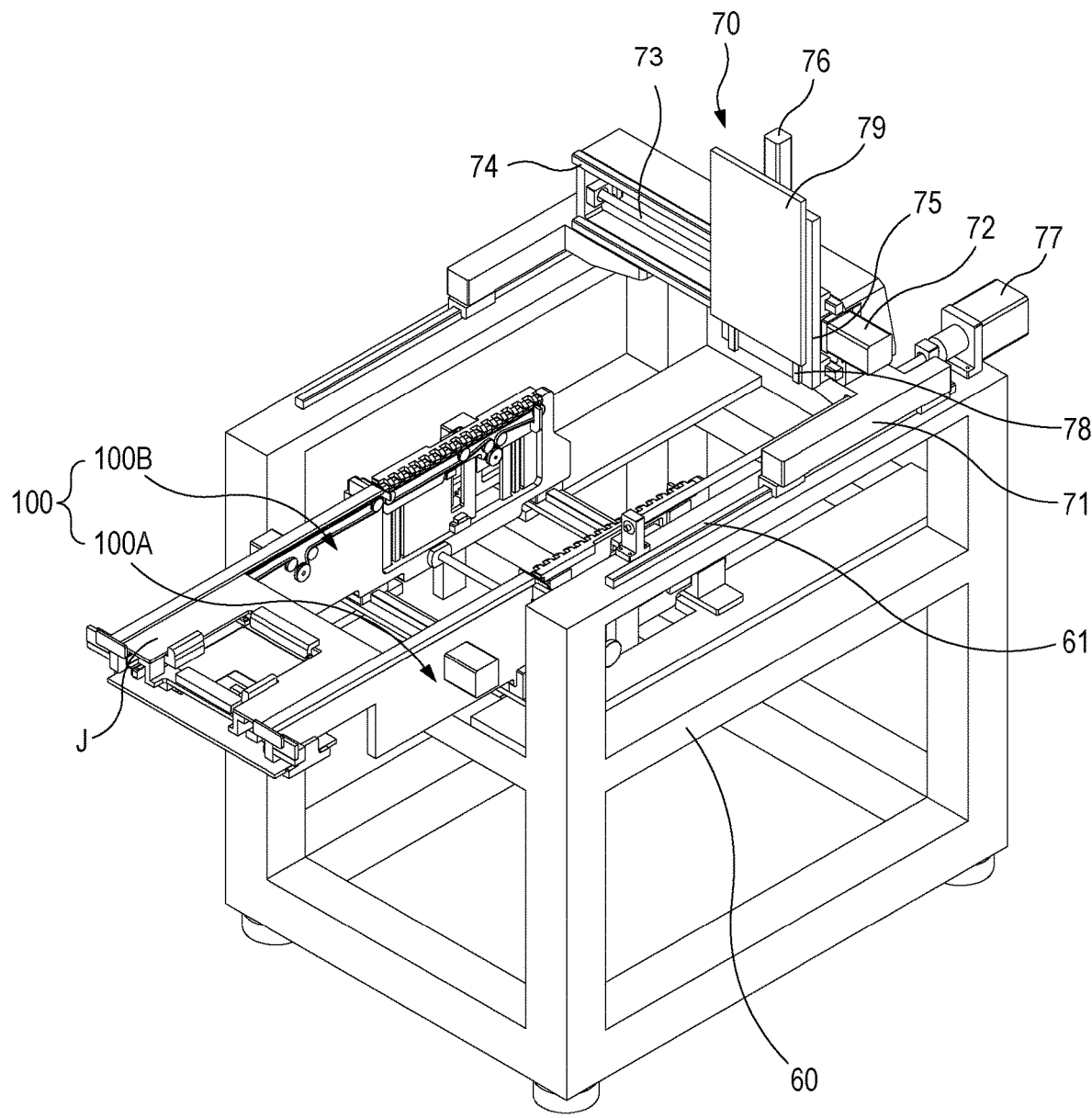
FIG. 2 is a perspective view showing the structure inside the case 10 shown in FIG. 1.

FIG. 1 is a perspective view of an inspection apparatus 1 according to a first embodiment of the present disclosure. FIG. 2 is a perspective view showing the structure inside the case 10 shown in FIG. 1. Referring to FIGS. 1 and 2, the inspection apparatus 1 is configured to inspect an object. The inspection apparatus 1 is capable of moving a transferred article.

The transferred article includes an inspection object. The transferred article may further include a jig J. In some embodiments, the inspection apparatus 1 may be configured to move the object with the jig J, or may be configured to move the object without the jig J. In the embodiment (e.g., the first embodiment) of the inspection apparatus 1 in which the object is moved with the jig J, the jig J and the object may be referred to as 'transferred article'. In the embodiment (e.g., the second embodiment) of the inspection apparatus 1 in which the object is moved without the jig J, the object may be referred to as a 'transferred article'.

In the present embodiment, the inspection apparatus 1 inspects failure of insertion of pins inserted into the object. In this case, the object may be a substrate. For example, the failure may occur due to the characteristics of the pins inserted into the object, the setting error of a pin insertion apparatus, the mechanical clearance or defect of the pin insertion apparatus, the non-planarity of the object, and the like.

For example, the external pin insertion apparatus (not shown) may perform a process of inserting a plurality of pins into a substrate as an object, and the substrate (object) into which the pins are inserted may be transferred to the inspection apparatus 1. The inspection apparatus 1 may inspect the insertion state of each of the pins inserted into the substrate. The inspection apparatus 1 may irradiate pattern light to the substrate and may receive the pattern light reflected from each of the pins inserted into the substrate. The inspection apparatus 1 may measure a height, an insertion position, etc. of each of the pins through the use of the received pattern light, and inspect the insertion state of each of the pins through the use of the measured information. The inspection apparatus 1 may quickly and accurately inspect the insertion state of the pins inserted into the object by using the information measured through the pattern light. In another embodiment, the inspection apparatus 1 may inspect the surface of the object, inspect the position of an element seated on the object, or inspect the defect of a conductor printed on the object.

In the first embodiment, the object may be seated on and separated from the jig J. For example, the inspection set 1, J may be equipment for a manual line that requires the handling of an operator in an operation of loading and unloading the object, and the like. The object may be seated (loaded) on the jig J for inspection purposes, and may be separated (unloaded) from the jig J after the object is inspected. The object may be clamped to the jig J. The object may be unclamped from the jig J.

In the first embodiment, the jig J is configured to be introduced into and removed from the inspection apparatus 1. When the type or specification of the object is changed, the jig J may be removed from the inspection apparatus 1, and a different type of jig on which the changed object can be seated may be introduced into the inspection apparatus 1.

The inspection apparatus 1 moves the transferred article. The inspection apparatus 1 includes a transfer apparatus 100. The transfer apparatus 100 includes a mover 110 configured to move the transferred article. The transferred article may be placed on the mover 110. Specifically, the jig J may be placed on the mover 110, and the object may be seated on the jig J.

The inspection apparatus 1 has an inlet through which an uninspected object is introduced. The inspection apparatus 1 has an outlet through which an inspected object is discharged. In the first embodiment, the inlet and the outlet are formed at one position. In another embodiment (second embodiment), the inlet and the outlet may be formed at different positions. The jig J may be introduced into or removed from the inspection apparatus 1 through the inlet and/or the outlet.

The inspection apparatus 1 may include a case 10 constituting a shell of the inspection apparatus 1, an output part 20 configured to output various types of information, and an input part 30 configured to input various types of information. The inspection apparatus 1 may include a communication circuit (not shown), a memory (not shown), a light source (not shown), an image sensor (not shown), and a control part (not shown). The respective components included in the inspection apparatus 1 may be electrically connected to each other to transmit and receive signals, data and the like.

The communication circuit may communicate with an external electronic device or an external server. The communication circuit may be connected to a network through wireless communication or wired communication to communicate with an external electronic device or an external server. As another example, the communication circuit may be connected to an external electronic device through wire to communicate.

The wireless communication may include, for example, cellular communication (e.g., LTE, LTE Advance (LTE-A), Code Division Multiple Access (CDMA), Wideband CDMA (WCDMA), Universal Mobile Telecommunications System (UMTS), Wireless Broadband (WiBro), and the like). Furthermore, the wireless communication may include short-range wireless communication (e.g., Wireless Fidelity (WiFi), Light Fidelity (LiFi), Bluetooth, Bluetooth Low Power (BLE), Zigbee, Near Field Communication (NFC), the like).

The output part 20 may output inspection result information for the object. When it is determined by the inspection result that the object is defective, the output part 20 may output information on the defective portion so that an operator can directly determine whether the object is defective. The information on the defective portion may include a 2D image, a 3D image, and/or various types of dimensional information of the defective portion.

The output part 20 may include a display. In one embodiment, the display may include a liquid crystal display (LCD), a light emitting diode (LED) display, an organic light emitting diode (OLED) display, or the like. For example, the display may present various contents (e.g., text, images, videos, icons, and/or symbols) to a user. The display may include a touch screen, and may receive, for example, a touch, gesture, proximity or hovering input using an electronic pen or a part of the user's body.

The input part 30 includes a start input part 31 configured to start an object inspection process of one cycle. For example, the start input part 31 may include a button. Alternatively, the start input part 31 may be configured by any one of various known means such as a dial, a keyboard, a mouse, a touch screen and the like. The input part 30 may further include a keyboard 32 and a mouse 33.

The object inspection process of one cycle may include a process of loading an object, a process of moving and inspecting the object, and a process of unloading the object. The object inspection process of one cycle may further include a process of clamping the object to the jig J after the loading process. The object inspection process of one cycle may further include a process of unclamping the object from the jig J before the loading process. A detailed description thereof will be given later.

The control part may include a processor such as a computer or the like. For example, the processor may include a CPU, a microcontroller (MCU) and the like. The control part may operate the inspection apparatus 1 based on the information inputted through the input part 30. The control part may operate the inspection apparatus 1 based on the information acquired through various sensors. The control part may operate the inspection apparatus 1 based on the information acquired through image sensors to be described later. The control part may process a program related to the inspection of the object. The control part may control the output part 20 to output various types of processed information. The control part may execute control to operate various drivers such as a motor or a pneumatic cylinder to be described later.

In one embodiment, the light source may irradiate pattern light to the object. The light source may irradiate the pattern light to the entire object or to irradiate the pattern light to at least one target included in the object. For example, the at least one target may be a pin inserted into the substrate. The light source may irradiate pattern light to the substrate into which a plurality of pins is inserted.

For example, the light source may include a grating (not shown), a grating transfer device (not shown), and a projection lens part (not shown). The grating may convert light irradiated from the light source into pattern light. The grating may be transferred by a grating transfer apparatus such as a piezo actuator (PZT) or the like to generate a phase-shifted pattern light. The projection lens part may irradiate the pattern light generated by the grating to the object.

As another example, the light source may include Digital Light Processing (DLP) or Liquid Crystal On Silicon (LCoS). The DLP or the LCoS may convert the light irradiated from the light source into pattern light so as to be irradiated to the object.

The pattern light may be light having a pattern of a constant or specific period, which is irradiated to measure a three-dimensional shape of the object. The light source may irradiate pattern light in which the brightness of stripes has a sine wave pattern, on-off pattern light in which bright and dark parts are repeatedly displayed, or triangular wave pattern light in which a change in brightness is a triangular waveform. However, the present disclosure is not limited thereto. The light source may irradiate light having various types of patterns in which a change in brightness is repeated at a constant or specific period.

The light source may irradiate first wavelength light, second wavelength light and third wavelength light to the object. The light source may irradiate the first wavelength light, the second wavelength light and the third wavelength light to the entire object or at least one target included in the object.

In one embodiment, the light source may sequentially irradiate the first wavelength light, the second wavelength light and the third wavelength light, or may simultaneously irradiate at least two of the first wavelength light, the second wavelength light and the third wavelength light. For example, the first wavelength light may be red light, the second wavelength light may be green light, and the third wavelength light may be blue light. However, the present disclosure is not limited thereto. The first wavelength light, the second wavelength light and the third wavelength light may be light having different wavelengths.

Any one of a variety of known image sensors may be used as the image sensor. In one embodiment, the image sensor may receive the pattern light reflected from each of a plurality of pins inserted into the object. For example, the image sensor may receive pattern light reflected from each of the plurality of pins inserted into the object, and may generate an image (e.g., a three-dimensional image) for each of the plurality of pins by using the received pattern light.

Furthermore, the image sensor may receive the first wavelength light, the second wavelength light and the third wavelength light reflected from each of the plurality of pins inserted into the object. For example, when the first wavelength light, the second wavelength light and the third wavelength light are irradiated from the light source to the object, the image sensor may receive the first wavelength light, the second wavelength light and the third wavelength light reflected from each of the plurality of pins inserted into the object, and may generate an image (e.g., a two-dimensional image) of each of the plurality of pins by using the first wavelength light, the second wavelength light and the third wavelength light thus received. The image sensor may transmit the image of each of the plurality of pins to the control part. Alternatively, a plurality of image sensors may receive light from the same direction or different directions. For example, the image sensor may include a charge coupled device (CCD) camera, a complementary metal oxide semiconductor (CMOS) camera, and the like, but is not limited thereto.

The memory may store instructions or data related to at least one other component of the inspection apparatus 1. Furthermore, the memory may store software and/or programs. For example, the memory may include an internal memory or an external memory. The internal memory may include at least one of a volatile memory (e.g., a DRAM, an SRAM or an SDRAM), and a non-volatile memory (e.g., a flash memory, a hard drive or a solid state drive (SSD)). The external memory may be functionally or physically connected to the inspection apparatus 1 through various interfaces.

The memory may store instructions for causing the control part to operate. For example, the memory may store instructions that cause the control part to control other components of the inspection apparatus 1 and to interwork with an external electronic device or server. The control part may control other components of the inspection apparatus 1 based on the instructions stored in the memory, and may interwork with an external electronic device or server. In addition, instructions for causing the respective components to perform operations may be stored in the memory.

In one embodiment, the memory may store pin insertion reference information indicating a reference height and a reference position set for the plurality of pins inserted into the object. The reference height and the reference position set for each of the plurality of pins may be used to determine failure of insertion of each of the plurality of pins. Pin insertion reference information may be set according to object design information or user input.

In an embodiment, the memory may store information on a plurality of process parameters related to a pin insertion process of a pin insertion apparatus and information on values of the plurality of process parameters used in the pin insertion process performed on the object by the pin insertion apparatus. The information on the plurality of process parameters and the information on the values of the plurality of process parameters may be received from the pin insertion apparatus and stored in the memory, or may be generated by user input and stored in the memory. For example, the information on the plurality of process parameters may include information which indicates whether each of the plurality of process parameters can affect the pin insertion position, the pin bending, the inserted pin height, the pin shoulder coplanarity of the inserted pin, the pin insertion angle, and the like.

The control part may control at least one other component of the inspection apparatus 1 by driving an operating system or an application program, and may perform various data processing and calculations. For example, the control part may include a central processing unit or the like, and may be implemented as a system on chip (SoC).

Referring to FIG. 2, the inspection apparatus 1 includes a frame 60. The frame 60 supports a transfer apparatus 100. The frame 60 supports a case 10. The frame 60 supports an image sensor moving device 70. The frame 60 supports various other components disposed directly on the frame 60 or disposed through other components.

The inspection apparatus 1 includes an image sensor moving device 70 that moves the image sensor. The image sensor moving device 70 may move the image sensor in a front-rear direction, a left-right direction, and/or an up-down direction.

The image sensor moving device 70 includes a first slider 71 configured to be slidable in the front-rear direction along a guide rail 61 fixed to the frame 60. The image sensor moving device 70 includes a driver 77 such as a motor or the like configured to provide a driving force for moving the first slider 71 in the front-rear direction. The image sensor moving device 70 includes a guide rail 74 fixed to the first slider 71 and extending in the left-right direction, and a second slider 75 configured to be slidable in the left-right direction along the guide rail 74. The image sensor moving device 70 includes a driver 72 such as a motor or the like configured to provide a driving force for moving the second slider 75 in the left-right direction. The image sensor moving device 70 includes a guide rail 78 fixed to the second slider 75 and extending in the up-down direction, and a third slider 79 configured to be slidable in the up-down direction along the guide rail 78. The image sensor moving device 70 includes a driver 76 such as a motor or the like configured to provide a driving force for moving the third slider 79 in the up-down direction. The image sensor may be fixed to the third slider 79. The image sensor may be arranged to sense light in a downward direction.

The image sensor moving device 70 may include a driving force transmitting part configured to transmit a driving force from each driver such as a motor or the like to the corresponding slider. The driving force transmitting part may include a lead screw or the like rotated by a motor. For example, when the lead screw 73 is rotated by the motor 72, the second slider 75 may move left and right along the lead screw 73. In the same way, a motor 77 and each lead screw rotated by a motor 76 may be provided. However, this is nothing more than an example in which the sliders 71, 75 and 79 are operated by the drivers. The present disclosure is not limited thereto.

Figure 3:
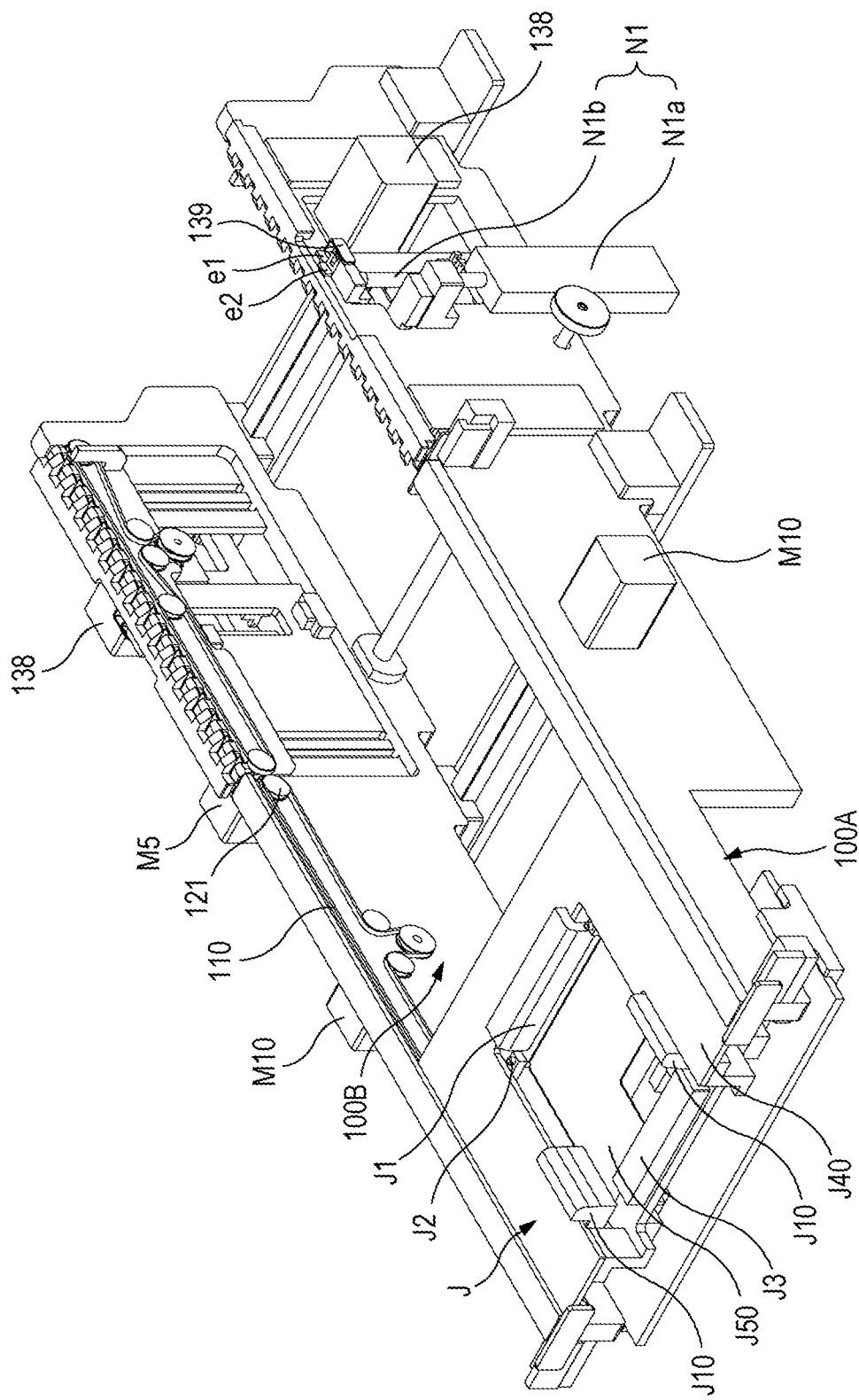
FIG. 3 is a perspective view of the transfer apparatuses 100A and 100B and the jig J shown in FIG. 2.
Figure 4:
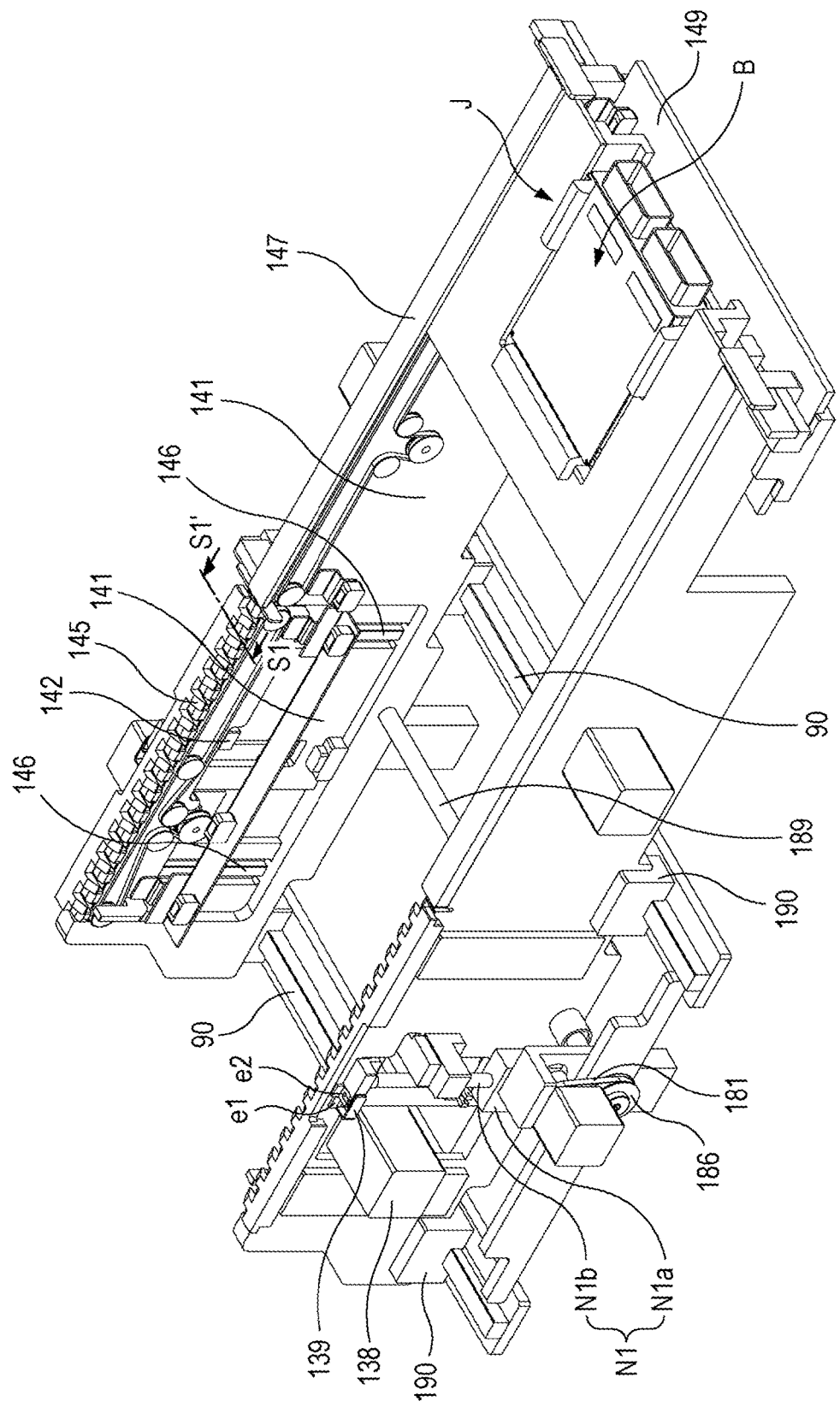
FIG. 4 is a perspective view showing a state in which the object B is seated on the transfer apparatuses 100A and 100B and the jig J shown in FIG. 3.

FIG. 3 is a perspective view of the transfer apparatuses 100A and 100B and the jig J shown in FIG. 2. FIG. 4 is a perspective view showing a state in which the object B is seated on the transfer apparatuses 100A and 100B and the jig J shown in FIG. 3. Referring to FIGS. 3 to 4, the jig J may include a guide wall J1 configured to make contact with the side surface (e.g., the rear side surface) of the object B. The jig J may include a guide pin J2 configured to be inserted into a groove or hole of the object B. The jig J may include a guide step J3 configured to make contact with the lower surface of the object B.

The jig J may include one or more dampers J10 configured to clamp the object B. The one or more dampers J10 may include a pair of dampers J10*a* and J10*b*. The jig J may include a clamping guide (not shown) configured to guide the jig J in the movement direction of the dampers J10. The jig J may include an elastic member (not shown) configured to provide an elastic force for pressing the dampers J10 in a predetermined clamping direction. The jig J may include a support J40 configured to be supported by the transfer apparatus 100. The jig J may include a lower cover J50 fixed to the support J40.

The dampers J10 are movable in a clamping direction in which the object B is clamped to the jig J. The dampers J10 are movable in an unclamping direction opposite to the clamping direction. The dampers J10 may be configured to make contact with the object B. The damper J10 may be configured to make contact with the inspection apparatus 1 to receive a driving force for moving the dampers J10.

Referring to FIG. 4, in the present embodiment, the object B is a substrate such as a printed circuit board (PCB) or the like. In another embodiment, the object B may be various other parts or products. Connectors may be attached to a substrate by a pin insertion method. The inspection apparatus 1 may inspect the insertion state of the pins inserted into the substrate. For example, a portion of the object B may be an inspection target portion.

Figure 5:
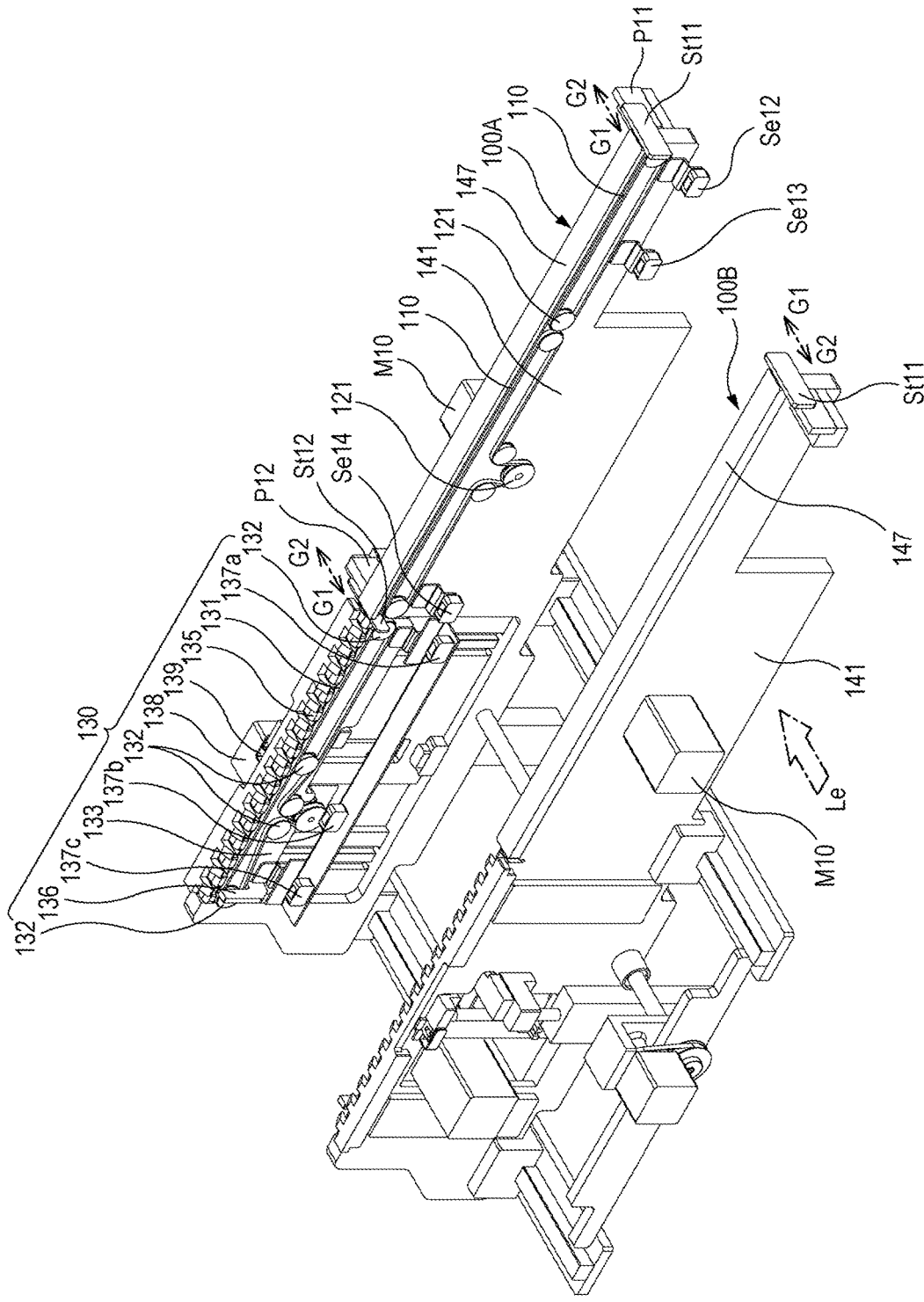
FIG. 5 is a perspective view showing a state in which the distance between the first transfer apparatus 100A and the second transfer apparatus 100B shown in FIG. 4 is changed.
Figure 6:
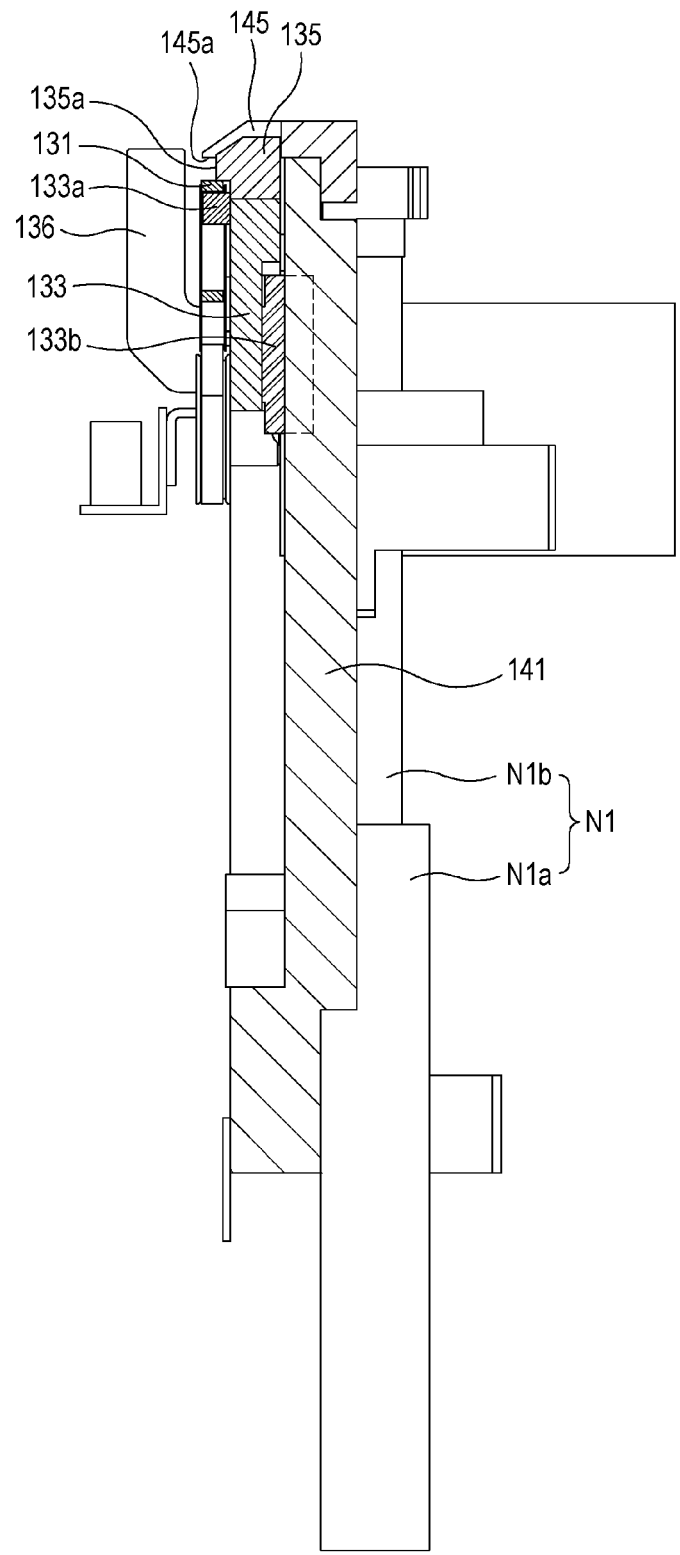
FIG. 6 is a sectional view of one transfer apparatus 100A shown in FIG. 5, which is taken along line S1-S1'.

FIG. 5 is a perspective view showing a state in which the distance between the first transfer apparatus 100A and the second transfer apparatus 100B shown in FIG. 4 is changed. FIG. 6 is a sectional view of one transfer apparatus 100A shown in FIG. 5, which is taken along line S1-S1'. Referring to FIGS. 3 to 6, the inspection apparatus 1 includes a transfer apparatus 100 supported on a frame 60. The inspection apparatus 1 may include one or more transfer apparatuses 100A and 100B. The transfer apparatuses 100A and 100B may be configured such that the left and right end portions of the jig J are supported thereon. The transfer apparatuses 100A and 100B may include a first transfer apparatus 100A configured to support the left side portion of the transferred article and a second transfer apparatus 100B configured to support the right side portion of the transferred article. The transfer apparatuses 100A and 100B may be configured to be symmetrical in the left-right direction as a whole. Some components may be provided only in one of the transfer apparatuses 100A and 100B. Hereinafter, the description of the transfer apparatus 100 may be understood as a description of each of the transfer apparatuses 100A and 100B.

The transfer apparatus 100 includes an upper end engaging portion 145 configured to make contact with the upper surface of the transferred article including the object B. The transfer apparatus 100 includes a support frame 141 to which the upper end engaging portion 145 is fixed. The transfer apparatus 100 includes a lift 130 arranged on the support frame 141 so as to be movable in the up-down direction. The lift 130 includes a support part 131 configured to support the lower surface of the transferred article. The transfer apparatus 100 includes a lifting driver N1 configured to provide a driving force to move the lift 130 in the up-down direction. The transfer apparatus 100 may include a mover 110 configured to move the transferred article toward or away from the support part 131.

The support frame 141 supports the upper end engaging portion 145 and the lifting driver N1. The support frame 141 supports the mover 110. The support frame 141 supports pulleys 121, belts 122 and a motor M10. The support frame 141 supports the lift 130 so as to be movable in the up-down direction.

The support frame 141 is supported by the frame 60. The support frame 141 may have a plate shape having a thickness in the left-right direction as a whole. The support frame 141 may be formed to extend in the front-rear direction as a whole.

The transfer apparatus 100 includes a lower end stopper 142 configured to make contact with the lower surface of the lift 130 so as to set the maximum downward movement position of the lift 130. The lower end stopper 142 may be fixed to the support frame 141. When the lift 130 moves downward, the lift 130 may make contact with the lower end stopper 142. The lower end stopper 142 is disposed so as to be spaced downward from the upper end engaging portion 145.

The upper end engaging portion 145 is configured to make contact with the upper surface of one side portion, i.e., one of the left and right side portions of the transferred article. The support part 131 is configured to support the lower surface of one side portion of the transferred article. The side guide 135 is configured to make contact with the side end in the direction in which the one side portion is disposed, based on the center of the transferred article. In the first embodiment, the upper end engaging portion 145 may make contact with the upper surface of the jig J which is a portion of the transferred article, the support part 131 may support the lower surface of the jig J, and the side guide 135 may make contact with the side end of the jig J. The upper end engaging portion 145 may be fixed to the support frame 141.

Figure 11:
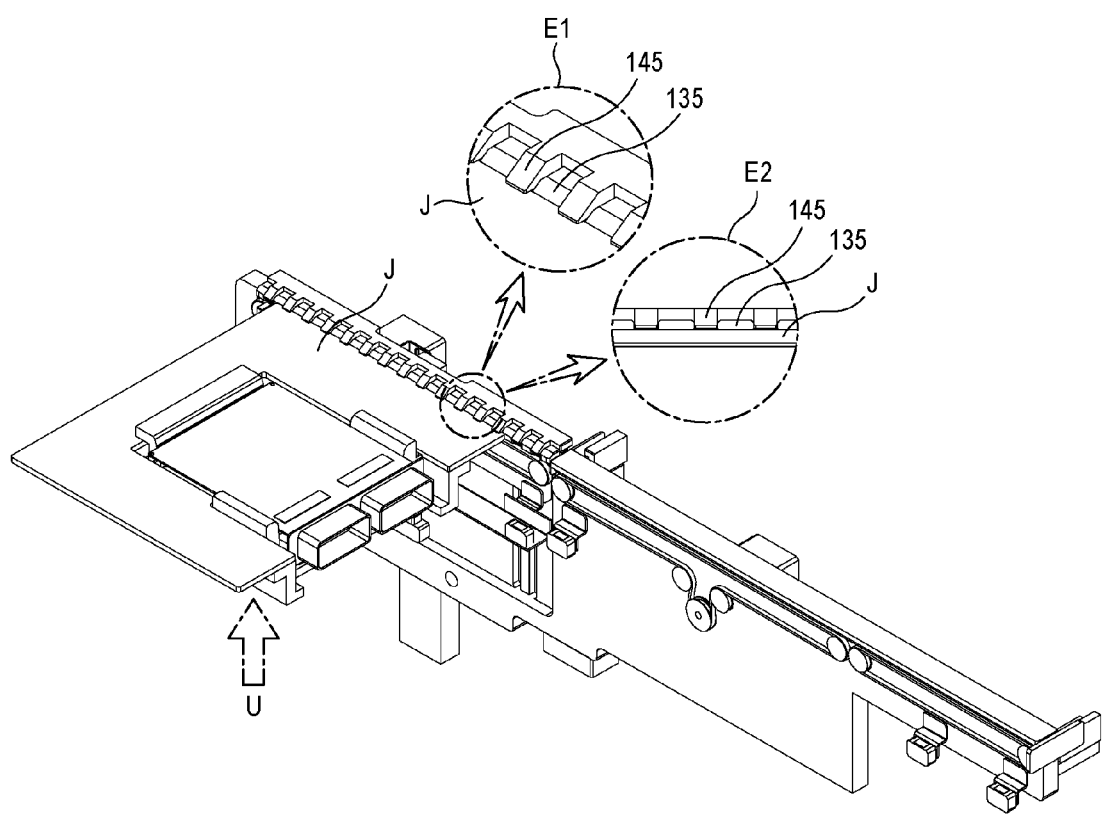

When the lift 130 moves upward, the upper surface of the transferred article comes into contact with the upper end engaging portion 145 (see FIG. 11). When the lift 130 moves downward, the upper surface of the transferred article is spaced apart from the upper end engaging portion 145 (see FIG. 12).

The upper end engaging portion 145 includes a lower surface 145a capable of making contact with the upper surface of the transferred article. The upper end engaging portion 145 may include a plurality of lower surfaces 145a arranged so as to be spaced apart from each other. The lower surfaces 145a may be arranged to form a plurality of gaps along the front-rear direction.

The upper end engaging portion 145 may include an upper end engaging protrusion 145 protruding laterally (left or right). The upper end engaging protrusion 145 may protrude from the corresponding transfer apparatus 100A or 100B in a direction (right or left) in which the transferred article is disposed. The upper end engaging protrusion 145 may protrude in a direction (right or left) in which the corresponding side guide 135 faces the transferred article. The upper end engaging protrusion 145 forms a lower surface 145a.

The upper end engaging portion 145 may include a plurality of upper end engaging protrusions 145 forming a plurality of gaps and spaced apart from each other in the front-rear direction. The upper end engaging protrusions 145 form a plurality of lower surfaces 145a. When the lift 130 moves upward, the side guide protrusions 135 of the side guide 135 may be inserted into the gaps between the upper end engaging protrusions 145 of the upper end engaging portion 145. When the lift 130 moves up and down, the side guide protrusions 135 may be moved up and down in the gaps between the upper end engaging protrusions 145.

The transfer apparatus 100 includes a lifting guide 146 configured to guide the up-down direction movement of the lift 130. The lifting guide 146 may have the shape of a rail extending in the up-down direction. The lifting guide 146 is fixed to the side surface of the support frame 141. The lifting guide 146 may be fixed to the side surface of the support frame 141 facing the transferred article.

The transfer apparatus 100 may include a transfer guide 147 configured to guide the movement direction of the transferred article. The transfer guide 147 may be fixed to the upper end of the support frame 141. The transfer guide 147 may include a side end guide portion (not shown) having a surface facing the left end or right end of the transferred article. The transfer guide 147 may include an upper end guide portion (not shown) having a surface facing the upper surface of the transferred article. The upper end guide portion may be connected to the upper end of the side end guide portion.

The transfer apparatus 100 may include an auxiliary frame 149 fixed to the support frame 141. The auxiliary frame 149 may be connected to the lower end of the support frame 141. The auxiliary frame 149 may be disposed so as to be spaced apart from the lower side of the transferred article. For example, a clamping driving unit (not shown) such as a cylinder or the like for operating the damper J10 of the jig J may be arranged on the auxiliary frame 149.

The lift 130 supports the transferred article and moves the transferred article in the up-down direction. The lift 130 includes a support part 131 configured to support the transferred article. The support part 131 may be configured to move the transferred article in the front-rear direction while supporting the lower surface of the transferred article. In the present embodiment, the support part 131 is a transfer belt 131 on which the transferred article is placed. In another embodiment not shown, the support part 131 may be formed in the form of a plate on which the transferred article is placed.

The lift 130 includes a support part 131 configured to support the transferred article moved in a rear direction by the mover 110. The support part 131 may move the transferred article in a front direction so that the jig J is supported by the mover 110.

The support part 131 may include a transfer belt 131 configured to support the jig J and move the jig J in the rear direction or in the front direction. The transfer belt 131 may support the lower surface of the transferred article.

The lift 130 may include a motor 138 configured to provide a driving force to the support part 131. When the motor 138 rotates, the transfer belt 131 may be operated. The lift 130 may include pulleys 132, belts and/or gears for operating the transfer belt 131, and may transmit the rotational force of the motor 138 to the transfer belt 131. For example, the lift 130 may include transfer pulleys 132 and a motor 138 configured to provide a driving force for rotating the transfer pulleys 132. The transfer belt 131 is configured to be wound and rotated around the transfer pulleys 132. One example of the pulleys 132 for transmitting a rotational force to the transfer belt 131 is shown in the drawings. However, the present disclosure is not limited thereto.

The lift 130 includes a lifting body 133 configured to support the support part 131. The lifting body 133 may support a plurality of pulleys 132 and a motor 138. The support part 131 may be moved up and down together with the lifting body 133. The transferred article supported by the support part 131 may be moved up and down together with the lifting body 13. The pulleys 132, the motor 138, the side guide 135, the rear end stopper 136, the sensors 137a, 137b and 137c and the lifting target 139 supported by the lifting body 133 may be moved up and down together with the lifting body 133.

The lifting body 133 may include a belt support portion 133a configured to support the lower surface of the transfer belt 131. The belt support portion 133a may protrude laterally from the support frame 141 and may extend in the front-rear direction. The belt support portion 133a may protrude in a direction in which the transfer belt 131 is disposed. This makes it possible to prevent the transfer belt 131 from sagging downward due to the load of the jig J. The lifting body 133 may include a body slider 133b whose movement is guided along the lifting guide 146.

The lift 130 includes a side guide 135 configured to make contact with the side surface (left side surface or right side surface) of the transferred article. The side guide 135 guides the position in the left-right direction of the transferred article.

The side guide 135 includes a side guide protrusion 135 protruding upward. The side guide 135 may include a plurality of side guide protrusions 135 spaced apart from each other in the front-rear direction. The side guide protrusions 135 protrude upward so as to be inserted into the gaps between the upper end engaging protrusions 145. When the lift 130 moves up and down, the side guide protrusions 135 of the side guide 135 may be inserted into the gaps between the upper end engaging protrusions 145 to move in the up-down direction.

The side guide protrusions 135 are configured to make contact with the left side surface or the right side surface of the transferred article. The side guide protrusions 135 form guide surfaces 135a in a direction facing the transferred article. The guide surfaces 135a may make contact with the side end of the transferred article.

The lift 130 includes a rear end stopper 136 configured to make contact with the rear surface of the transferred article to set the maximum rearward movement position of the transferred article. The rear end stopper 136 may be fixed to the lifting body 133. When the support part 131 moves the transferred article in the rear direction, the transferred article may make contact with the rear end stopper 136. The rear end stopper 136 may be disposed on the rear side of the support part 131.

The lift 130 includes a sensor 137a configured to detect the transferred article when the transferred article is located across the front-rear direction boundary between the mover 110 and the support part 131. The control part may recognize whether or not the transferred article straddles the mover 110 and the lift 130, based on the detection result of the sensor 137a. The sensor 137a may be disposed at the front end of the lift 130.

The lift 130 includes a sensor 137c configured to detect the transferred article when the transferred article is located at the maximum rearward movement position on the support part 131. The sensor 137c may detect the transferred article in a state in which the transferred article comes into contact with the rear end stopper 136. The control part may determine whether to perform the lifting operation of the lift 130, based on the detection result of the sensor 137c. The sensor 137c may be disposed at the rear end of the lift 130.

The lift 130 includes a sensor 137b configured to detect the transferred article before the transferred article comes into contact with the rear end stopper 136 when the transferred article moves in the rear direction from the front side. Based on the detection result of the sensor 137b, the control part may reduce the rearward movement speed of the transferred article before the transferred article comes into contact with the rear end stopper 136. In this case, by reducing the rotational speed of the transfer belt 131, it is possible to reduce the rearward movement speed of the jig J. The sensor 137b may be disposed at a position more frontward than the position of the sensor 137c.

The transfer apparatus 100 may include a plurality of lifting sensors e1 and e2 fixed to the support frame 141 to detect a plurality of set positions of the lift 130. The lift 130 may include a lifting target 139 detected by one of the lifting sensors e1 and e2 when the lift 130 is located at one of the set positions. In a state in which the lift 130 has moved to a preset upper limit position, the lifting sensor e2 detects the lifting target 139, and the control part may recognize that the lift 130 has moved to the preset upper limit position. In a state in which the lift 130 has moved to a preset predetermined position (a position lower than the upper limit position), the lifting sensor e1 detects the lifting target 139, and the control part may recognize that the lift 130 has moved to the present predetermined position. The predetermined position may be set to a position at which the upper surface of the mover 110 and the upper surface of the support part 131 are at the same level so that the transferred article can be moved from one of the mover 110 and the support part 131 to the other.

The mover 110 is configured to move the transferred article. The mover 110 may include a transfer belt 110, may include a ball screw for transferring the transferred article, or may include a robot arm for transferring the transferred article.

The mover 110 may be disposed in front of the support part 131. The mover 110 is configured to move the transferred article in the rear direction while supporting the transferred article. The mover 110 may be configured to move the transferred article in the front direction while supporting the transferred article. The mover 110 is configured to move the transferred article in the rear direction so that the support part 131 can support the transferred article. The support part 131 is configured to move the transferred article in the front direction so that the mover 110 can support the transferred article.

The mover 110 may be configured to move the transferred article in the front-rear direction in a slippable manner. The mover 110 may support the transferred article. The mover 110 may include a transfer belt 110 configured to support the transferred article and move the transferred article in the rear direction or in the front direction. The transferred article can be moved in the front-rear direction by the friction force between the transfer belt, on which the transferred article is placed, and the transferred article. When a load greater than the static friction force is applied to the transferred article due to the occurrence of an impact or the like, the transferred article can slide with respect to the transfer belt. Pulleys 121, belts 122 and/or gears for operating the transfer belt 110 may be provided to transmit the rotational force of a motor M10 to the transfer belt 110. One example of the pulleys 121 and the belts 122 for transmitting the rotational force to the transfer belt 110 is shown in the drawings. However, the present disclosure is not limited thereto.

The inspection apparatus 1 includes drivers M10, M5 and N1 such as motors or cylinders fixed to the transfer apparatus 100. The transfer apparatus 100 may include driving force transmitting parts such as belts and pulleys that transmit the driving forces from the drivers M10, M5 and N1 to operation configurations corresponding to the respective drivers M10, M3, M5 and N1.

The motor M10 provides a driving force to the mover 110. When the motor M10 rotates, the transfer belt 110 may operate. The motor M10 is supported by the support frame 141.

The width adjustment motor M5 provides a driving force to change the left-right distance between the transfer apparatuses 100A and 100B. The width adjustment motor M5 is supported on the frame 60.

The lifting driver N1 provides a driving force for the up/down movement of the lift 130. The lifting driver N1 is supported by the support frame 141. For example, the lifting driver N1 may include a pneumatic cylinder N1a and a cylinder rod N1b to be moved in the up-down direction by the pneumatic cylinder N1a. A lifting target 139 may be fixed to the cylinder rod N1b.

With reference to FIGS. 4 and 5, a left-right width adjustment driving apparatus for the pair of transfer apparatuses 100A and 100B will be described as follows. The inspection apparatus 1 includes a frame guide 90 configured to guide the lift-right movement of at least one of the pair of transfer apparatuses 100A and 100B. The frame guide 90 may be fixed to the frame 60. The inspection apparatus 1 includes a driver M5 configured to provide a driving force for moving at least one (100B) of the pair of transfer apparatuses 100A and 100B in the left-right direction. The driver M5 may be the aforementioned width adjustment motor. In the present embodiment, the second transfer apparatus 100B is configured to be movable in the left-right direction. However, the present disclosure is not limited thereto.

The at least one transfer apparatus includes a slider 190 configured to slide along the frame guide 90. The width adjustment driving apparatus includes a driving force transmitting part such as pulleys, belts, gears and/or a lead screw that transmits the driving force of the driver M5 to the at least one transfer apparatus. For example, the belts 181 and the pulleys 186 are rotated by the rotation of the motor M5, and the lead screw 189 is rotated by the rotation of the pulleys 186. When the lead screw 189 is rotated, one transfer apparatus 100B is moved in the left-right direction along the lead screw 189. FIG. 4 shows a state in which the second transfer apparatus 100B has moved to the right as far as possible, and FIG. 5 shows a state in which the second transfer apparatus 100B has moved to the left Le.

Referring to FIG. 5, the inspection apparatus 1 may include at least one sensor Se12, Se13 or Se14 for detecting the jig J when the jig J is arranged at a predetermined position. The at least one sensor may be fixed to the transfer apparatus 100. The inspection apparatus 1 may include a plurality of sensors Se12, Se13 and Se14. The at least one sensor may be arranged at a specific position to detect the transferred article when the transferred article is located in a sensing direction of the sensor. The sensing direction may be an upward direction.

The at least one sensor includes a sensor Se12 configured to detect the transferred article when the transferred article is located at a maximum forward movement position on the mover 110. The control part may determine whether to perform clamping and unclamping of the object B based on the detection result of the sensor Se12. The sensor Se12 may be disposed at the front end of the transfer apparatus 100.

The inspection apparatus 1 includes a sensor Se13 configured to detect the transferred article before the transferred article comes into contact with a stopper St11 when the transferred article moves in the rear direction from the front side. The control part may reduce the forward movement speed of the transferred article before the transferred article comes into contact with the stopper St11, based on the detection result of the sensor Se13. The sensor Se13 may be disposed at a position more rearward than the position of the sensor Se12.

The inspection apparatus 1 includes a sensor Se14 configured to detect the transferred article when the transferred article comes into contact with a front portion of a stopper St12. The control part may recognize that the transferred article is ready to move from the mover 110 to the lift 130, based on the detection result of the sensor Se14. The sensor Se14 may be disposed at a position more frontward than the position of the stopper St12.

The inspection apparatus 1 includes a stopper St11 configured to limit the maximum forward movement position of the transferred article. The stopper St11 is configured to be able to make contact with the front end of the transferred article when the transferred article is moved in the front direction by the mover 110. The stopper St11 is supported by the transfer apparatus 100. The stopper St11 is configured to be movable in predetermined directions G1 and G2. In a state in which the stopper St11 has moved in the releasing direction G2, the transferred article may be removed from or introduced into the transfer apparatus 100.

The inspection apparatus 1 includes a stopper driver P11 configured to move the stopper St11 in a stopping direction G1 and a releasing direction G2. In the present embodiment, the stopper driver P11 includes a pneumatic cylinder. The stopper driver P11 may include a motor or the like.

The inspection apparatus 1 includes a stopper St12 configured to make contact with the rear end of the jig J when the transferred article is moved in the rear direction by the mover 110. The stopper St12 is configured to make contact with the front end of the transferred article when the transferred article is moved in the front direction by the support part 131 such as a transfer belt or the like. The stopper St12 may be arranged at a front-rear direction boundary between the mover 110 and the support part 131. The stopper St12 is supported by the transfer apparatus 100. The stopper St12 is configured to be movable in predetermined directions G1 and G2. In a state in which the stopper St12 has moved in the releasing direction G2, the stopper St12 may deviate laterally on the movement path of the jig J so that the transferred article can move in the front direction or in the rear direction without the interference of the stopper St12.

The inspection apparatus 1 includes a stopper driver P12 configured to move the stopper St12 in the stopping direction G1 and the releasing direction G2. In the present embodiment, the stopper driver P12 includes a pneumatic cylinder. The stopper driver P12 may include a motor or the like.

Figure 8:
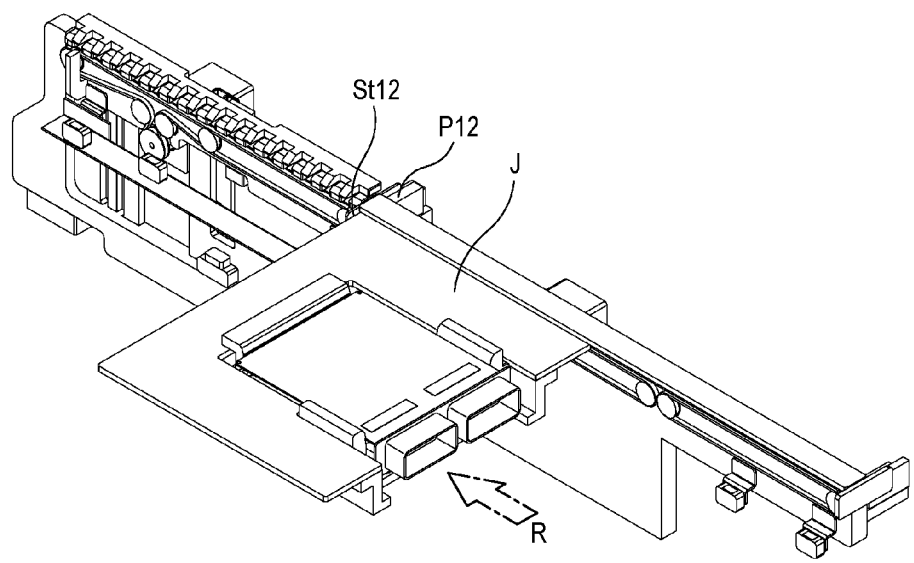
Figure 9:
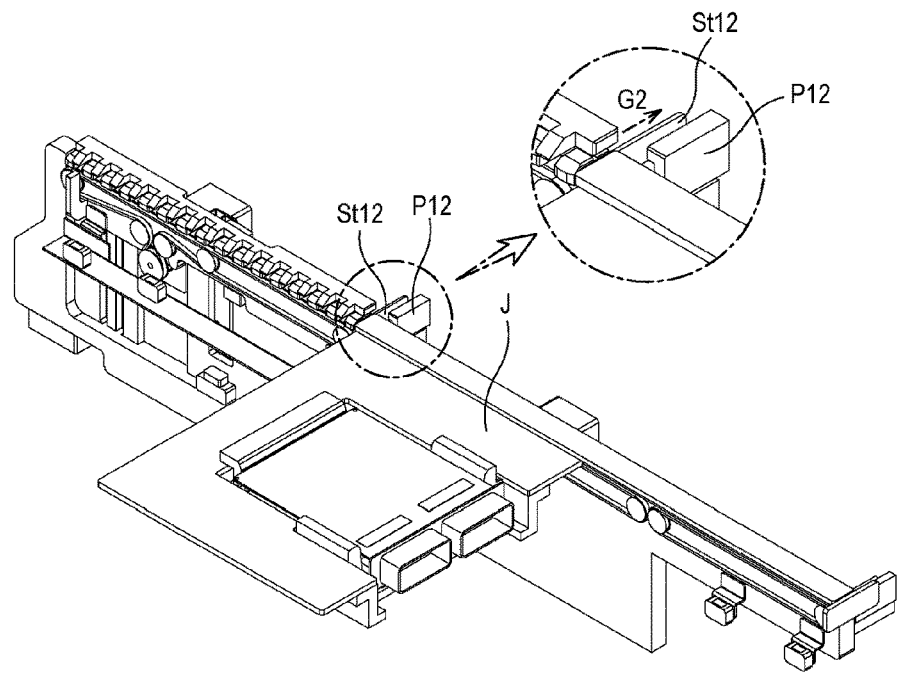
Figure 10:
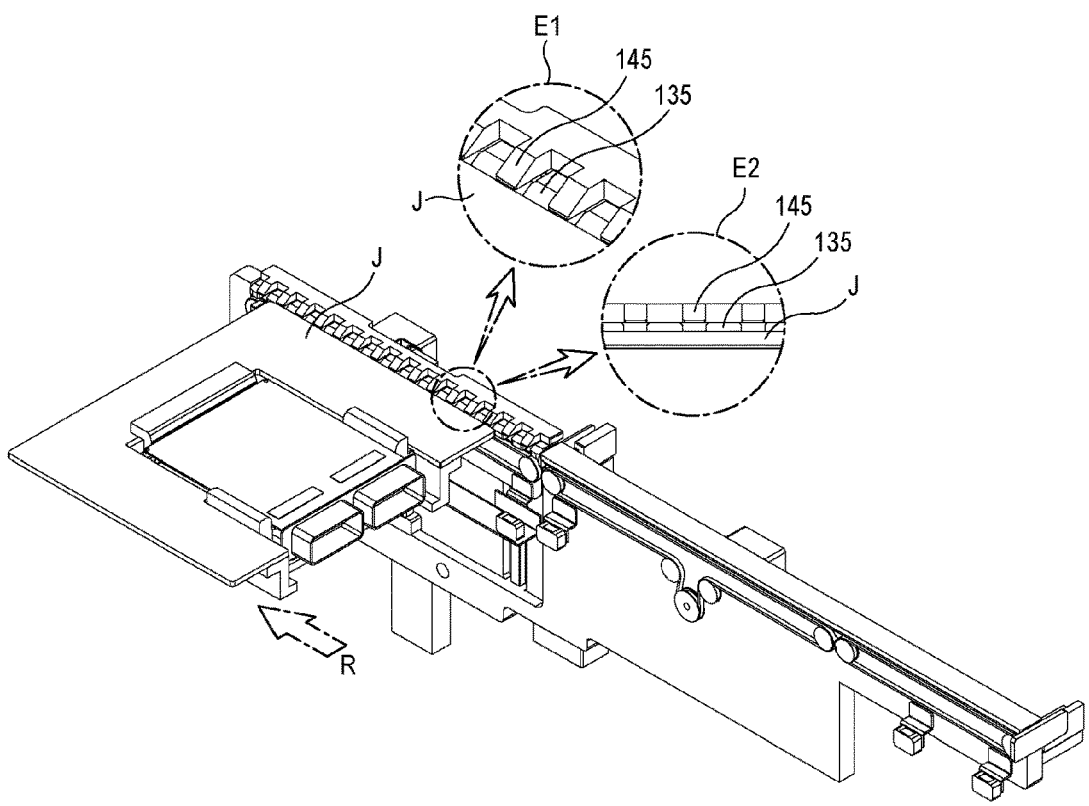
Figure 12:
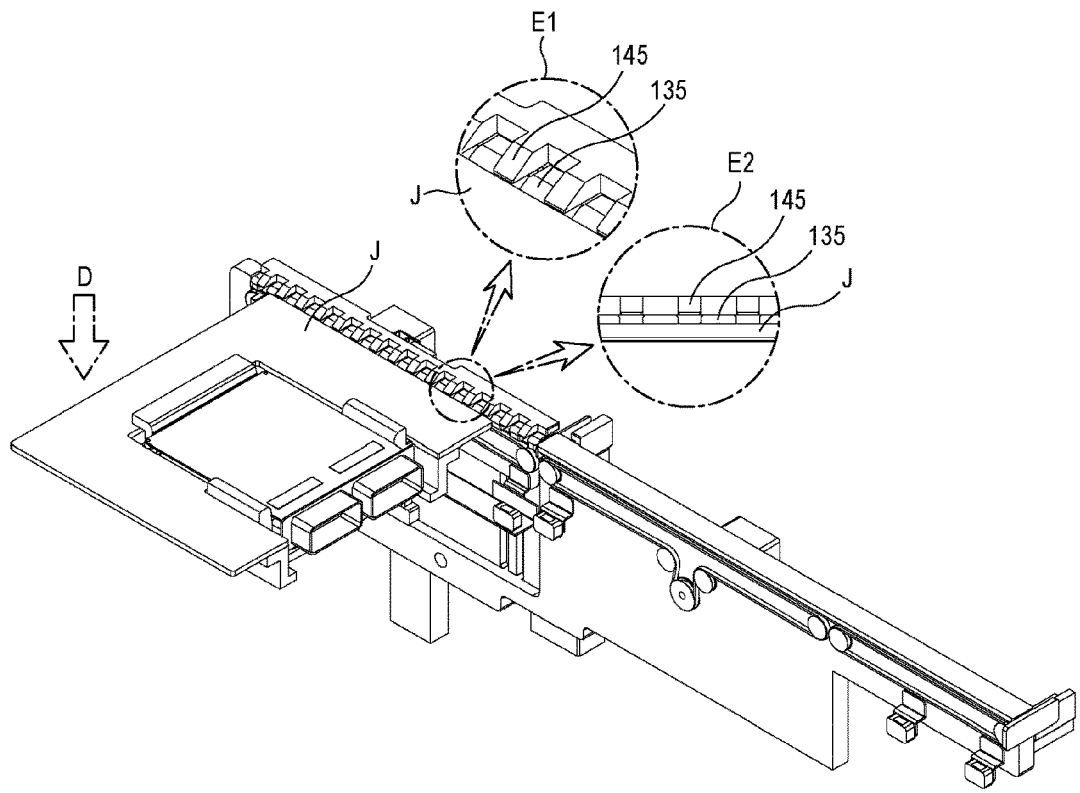

FIGS. 7 to 13 are perspective views illustrating the operations of the apparatus during the inspection process of one cycle based on one (100A) of the pair of transfer apparatuses 100A and 100B shown in FIG. 3. FIGS. 10 to 12 are partially enlarged perspective views E1 and partially elevation views E2 as viewed from the right side. Referring to FIGS. 7 to 13, the object inspection method and the operations of the apparatus in individual steps (see FIG. 25) will be described as follows. The object inspection method and the operations of the apparatus may be controlled by the control part. The object inspection method may use the inspection apparatus described above.

Although process steps, methods, algorithms, etc. are illustrated in a sequential order in the flowchart shown in the present disclosure, such processes, methods, and algorithms may be configured to be operated in any suitable order. In other words, the steps in the processes, methods, and algorithms explained in various embodiments of the present disclosure are not necessarily performed in the order described in the present disclosure. Further, even though some steps are explained as being performed non-simultaneously, such steps may be simultaneously performed in another embodiment. Moreover, the illustration of the processes depicted in the figure does not mean that the illustrated processes exclude other changes and modifications thereto, that any of the illustrated processes or the steps thereof is essential for at least one of various embodiments of the present disclosure, and that the illustrated processes are desirable.

Figure 7:
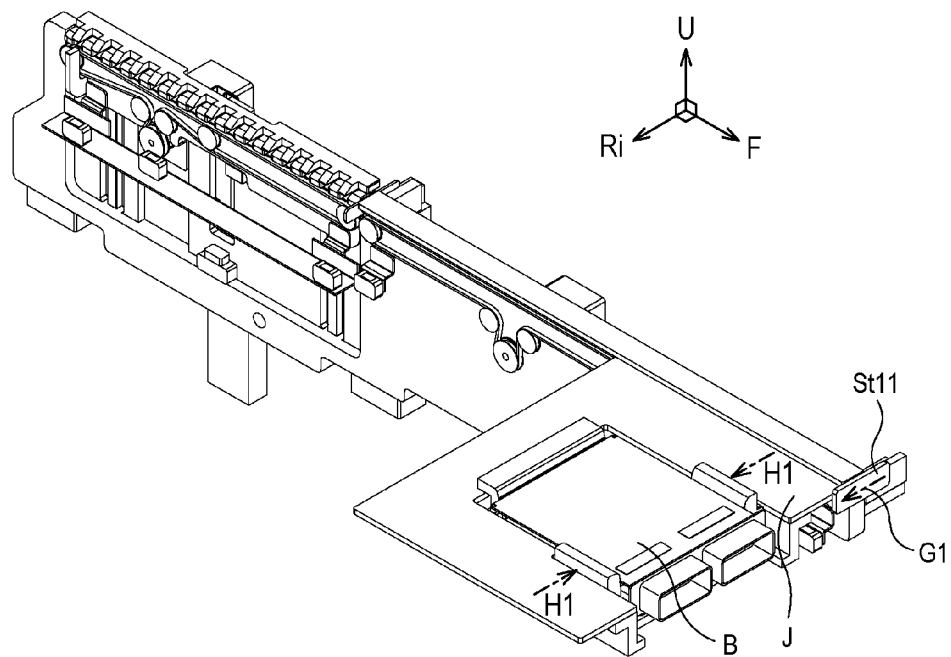
FIGS. 7 to 13 are perspective views illustrating the operation of the apparatus during an inspection process of one cycle based on one (100A) of the transfer apparatuses 100A and 100B shown in FIG. 3.

Referring to FIG. 7, the object inspection method may include a loading step S1 of seating the object B on the jig J and fixing the object B to the jig J. In the loading step S1, the object B may be seated on the jig J by an operator or a machine. In the loading step S1, the damper J10 may be moved in the clamping direction H1 to clamp the object B to the jig J. When the control part receives an input signal from the start input part 31, the clamping of the object may be performed, and then the following processes may be performed.

Referring to FIGS. 8 to 10, the object inspection method may include a rearward movement step S2 of moving the jig J in the rear direction R. In the rearward movement step S2, the transferred article may be moved in the rear direction by the support part 131. The rearward movement step S2 is performed before an upward movement step S3. Referring to FIG. 8, the transferred article placed on the mover 110 is moved in the rear direction R and stopped by the stopper St12 as the mover 110 operates. Referring to FIG. 9, the stopper St12 is moved in the releasing direction G2. Referring to FIG. 10, the transferred article is moved in the rear direction R and is placed on the support part 131. At this time, the jig J comes into contact with the rear end stopper 136.

Referring to FIG. 11, the object inspection method includes an upward movement step S3 of moving the jig J upward U. In the upward movement step S3, the lift 130 may be moved up to move the transferred article upward. In the upward movement step S3, the upper surface of the transferred article may come into contact with the upper end engaging portion 145. In the first embodiment, the lift 130 is moved up so that the upper end of the jig J makes contact with the lower surface of the upper end engaging portion 145. At this time, the upper ends of the side guide protrusions 135 of the side guide 135 may be inserted between the upper end engaging protrusions 145.

The object inspection method includes an inspection step S4 of inspecting the object B after the upward movement step S3 to determine whether the object B is defective. In the inspection step S4, the image sensor may inspect the object B. In the inspection step S4, the image sensor may be moved by the image sensor moving device 70. The inspection step S4 may be performed in a state in which the upper end of the transferred article is in contact with the lower surface of the upper end engaging portion 145.

The control part may determine whether the object B is defective, based on the detection signal of the image sensor. The control part may control the output part 20 to output predetermined information according to the inspection result. When it is determined based on the detection signal of the image sensor that the object B is defective, the control part may control the output part 20 to output information on a defective portion so that an operator can directly determine whether the object B is defective. When it is determined based on the detection signal of the image sensor that the object B is normal, the control part may perform the following process.

Referring to FIG. 12, the object inspection method includes a downward movement step S5 of moving the jig J downward D after the inspection step S4. In the downward movement step S5, the lift 130 may be moved downward to move the transferred article downward. In the downward movement step S5, the upper surface of the transferred article may be spaced apart from the upper end engaging portion 145. In the downward movement step S5, the lift 130 is moved downward so that the upper surface of the support part 131 is at the same level as the upper surface of the mover 110. At this time, the lift 130 comes into contact with the lower end stopper 142. At this time, the upper ends of the side guide protrusions 135 of the side guide 135 come out from between the upper end engaging protrusions 145.

Figure 13:
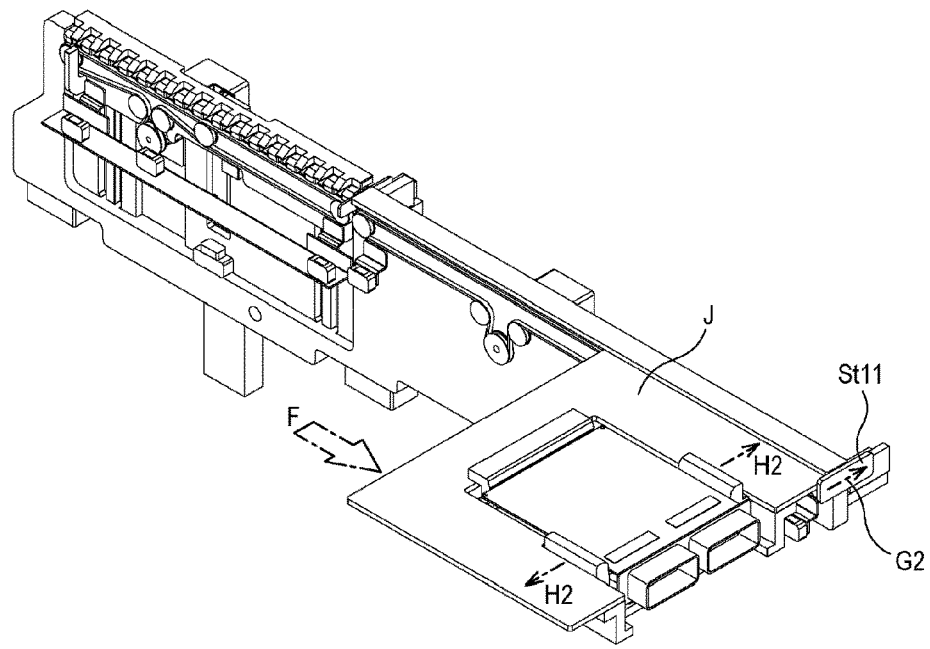

Referring to FIG. 13, the object inspection method may include a forward movement step S6 of moving the jig J in the front direction F. In the forward movement step S6, the transferred article may be moved in the front direction by the support part 131. The forward movement step S6 is performed after the downward movement step S5. In another embodiment not shown, the object inspection method may be performed without the rearward movement step S2 and/or the forward movement step S6.

In the forward movement step S6, the transferred article may be moved from the support part 131 to the mover 110. In the forward movement step S6, the transferred article is moved in the front direction and is stopped by the stopper St11.

The object inspection method may include an unloading step S7 of unclamping and removing the object B from the jig J after the forward movement step S6. In the unloading step S7, the damper J10 may be moved in the unclamping direction H2 in a state in which the jig J has moved in the front direction. After the object B is unclamped from the jig J, the object B may be removed from the jig J by an operator or a machine.

Hereinafter, the inspection apparatus 1' according to a second embodiment and the transferred article B will be described by focusing on the differences from the first embodiment described above. The above description of the first embodiment may be applied to the contents not described below with respect to the second embodiment.

Figure 14:
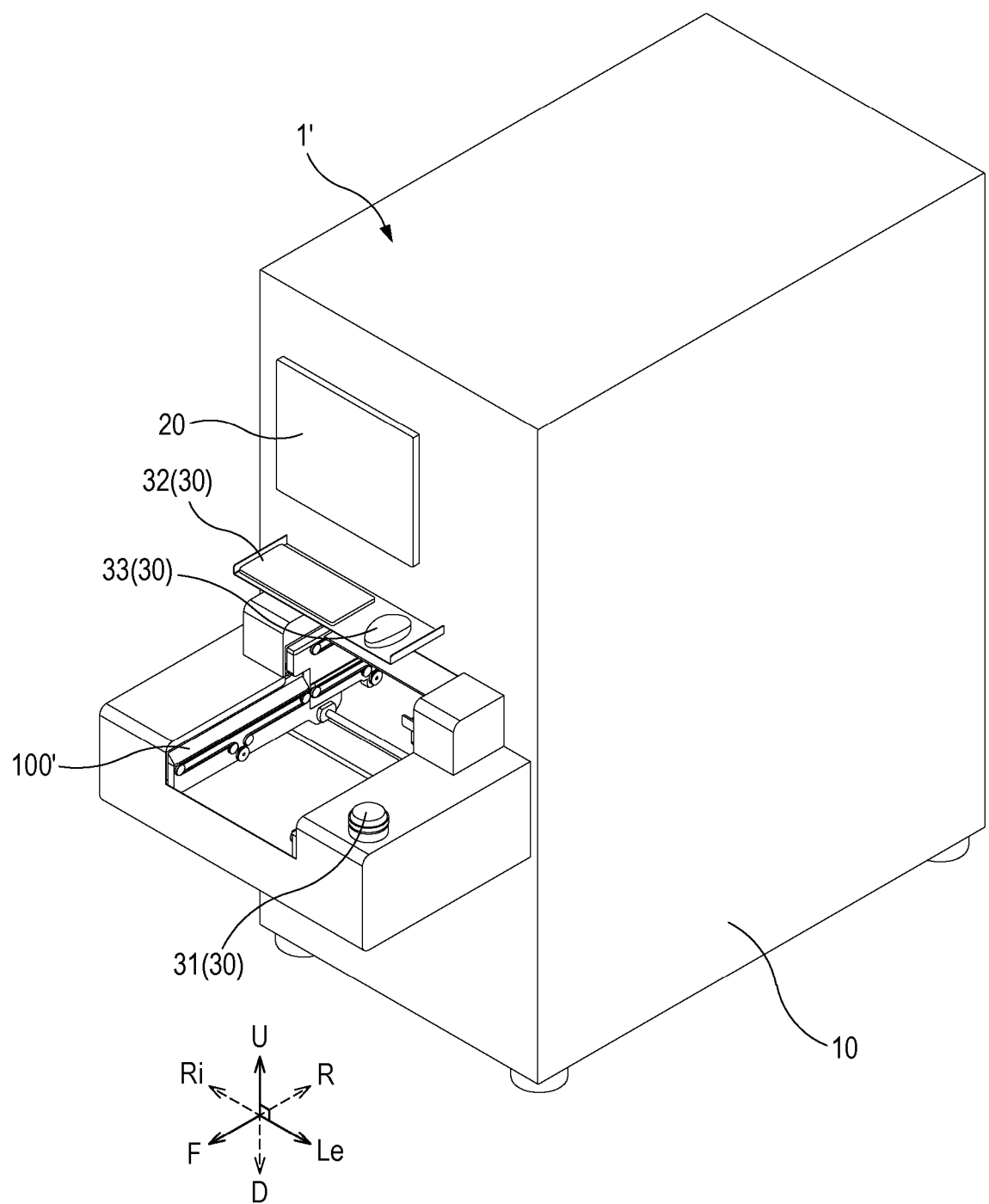
FIG. 14 is a perspective view of an inspection apparatus 1' according to a second embodiment of the present disclosure.

FIG. 14 is a perspective view of an inspection apparatus 1' according to a second embodiment of the present disclosure. Referring to FIG. 14, in the second embodiment, the object B is a transferred article. In the second embodiment, the jig J and the clamping driver may not be provided. The transferred article B can be introduced into and removed from the inspection apparatus 1' without having to use the jig. Specifically, the object B may be directly seated on the movers 111, 112, and 113. In the second embodiment, the inlet and the outlet may be spaced apart from each other in the up-down direction. In the present embodiment, the inlet is formed in the lower portion and the outlet is formed in the upper portion. However, the present disclosure is not limited thereto. The reverse arrangement may be adopted. The object B may be introduced into and removed from the inspection apparatus 1' through the inlet and the outlet.

Figure 15:
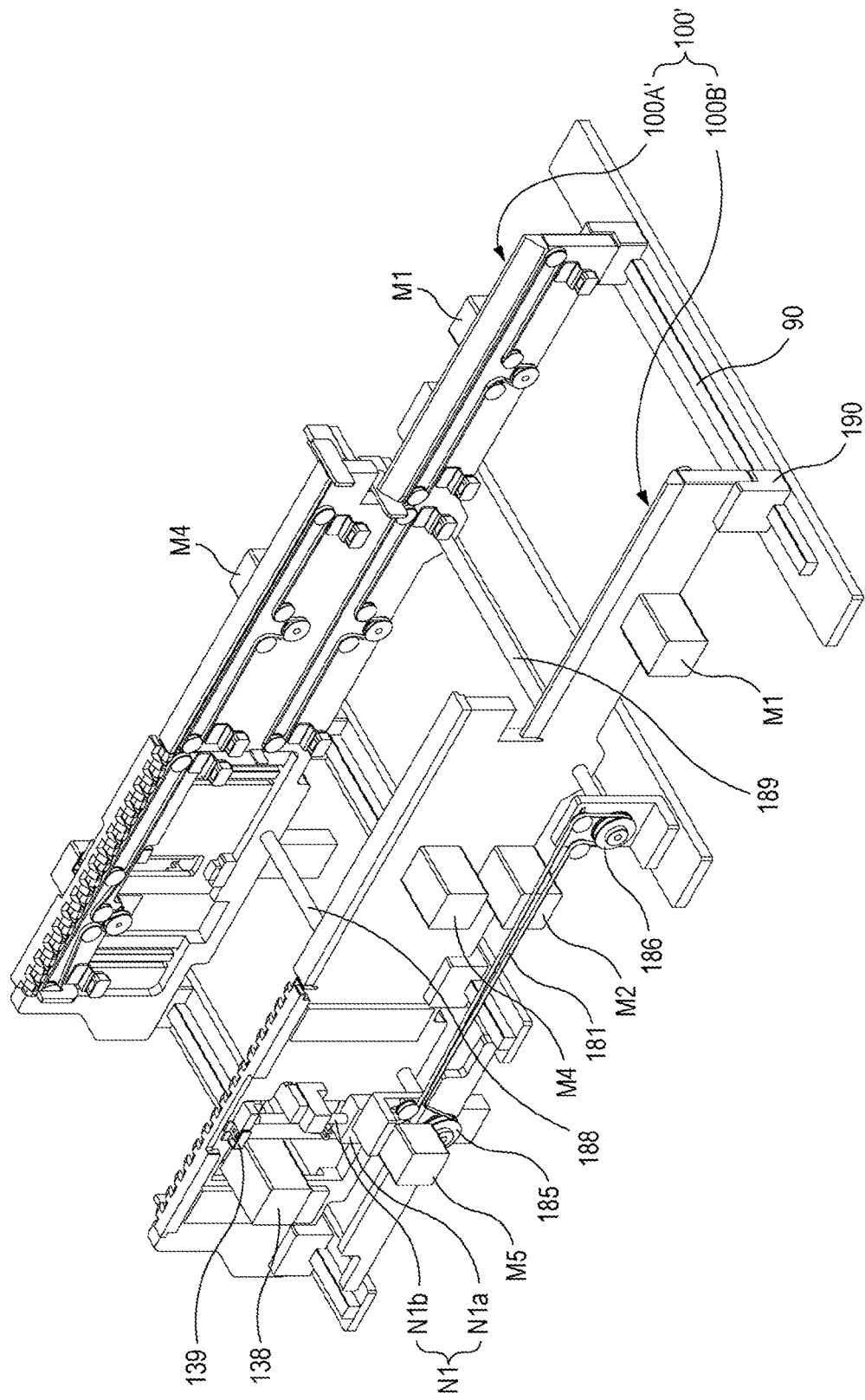
FIG. 15 is a perspective view of the transfer apparatuses 100A' and 100B' shown in FIG. 14.
Figure 16:
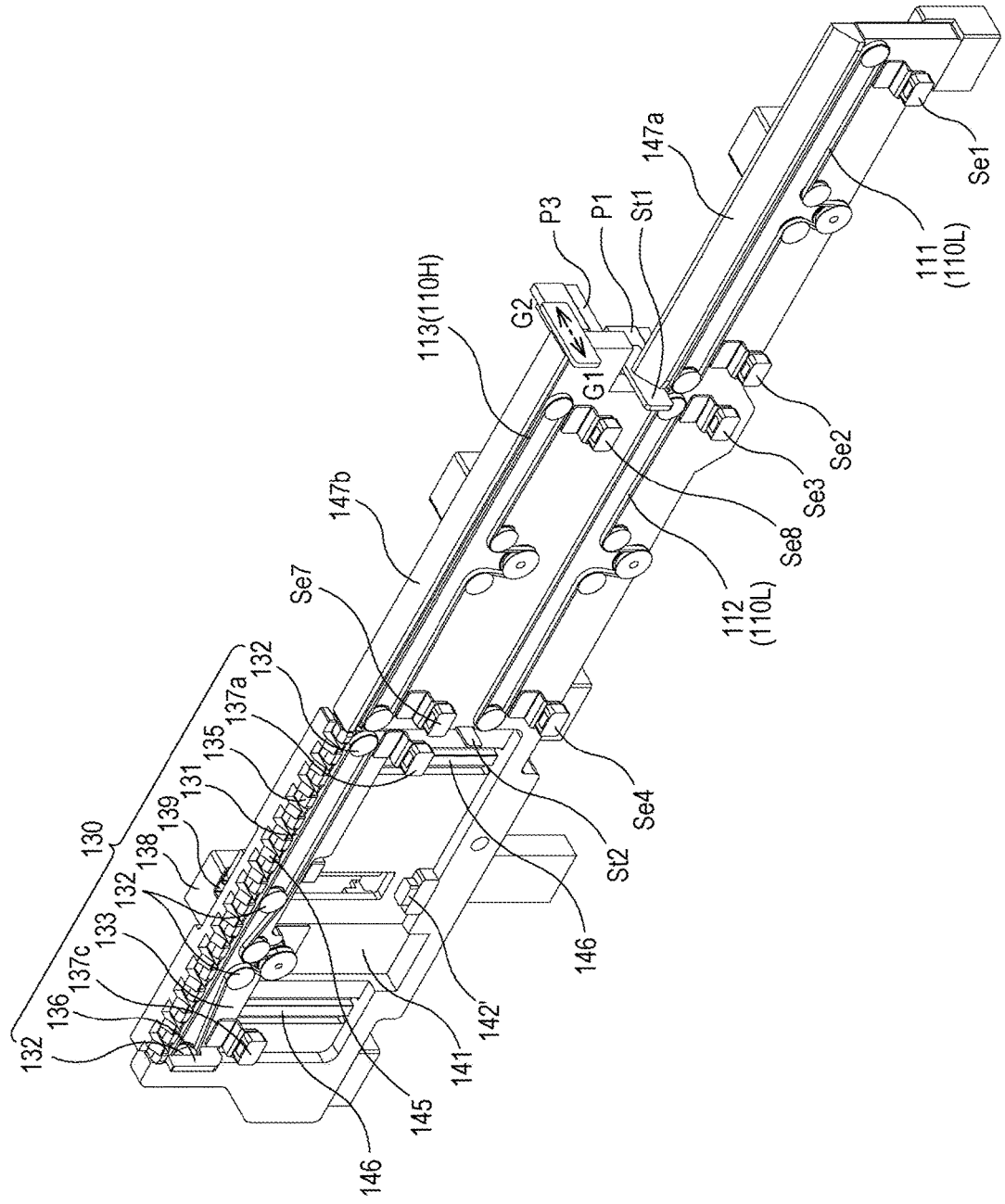
FIGS. 16 and 17 are perspective views of one transfer apparatus 100A' shown in FIG. 15.
Figure 17:
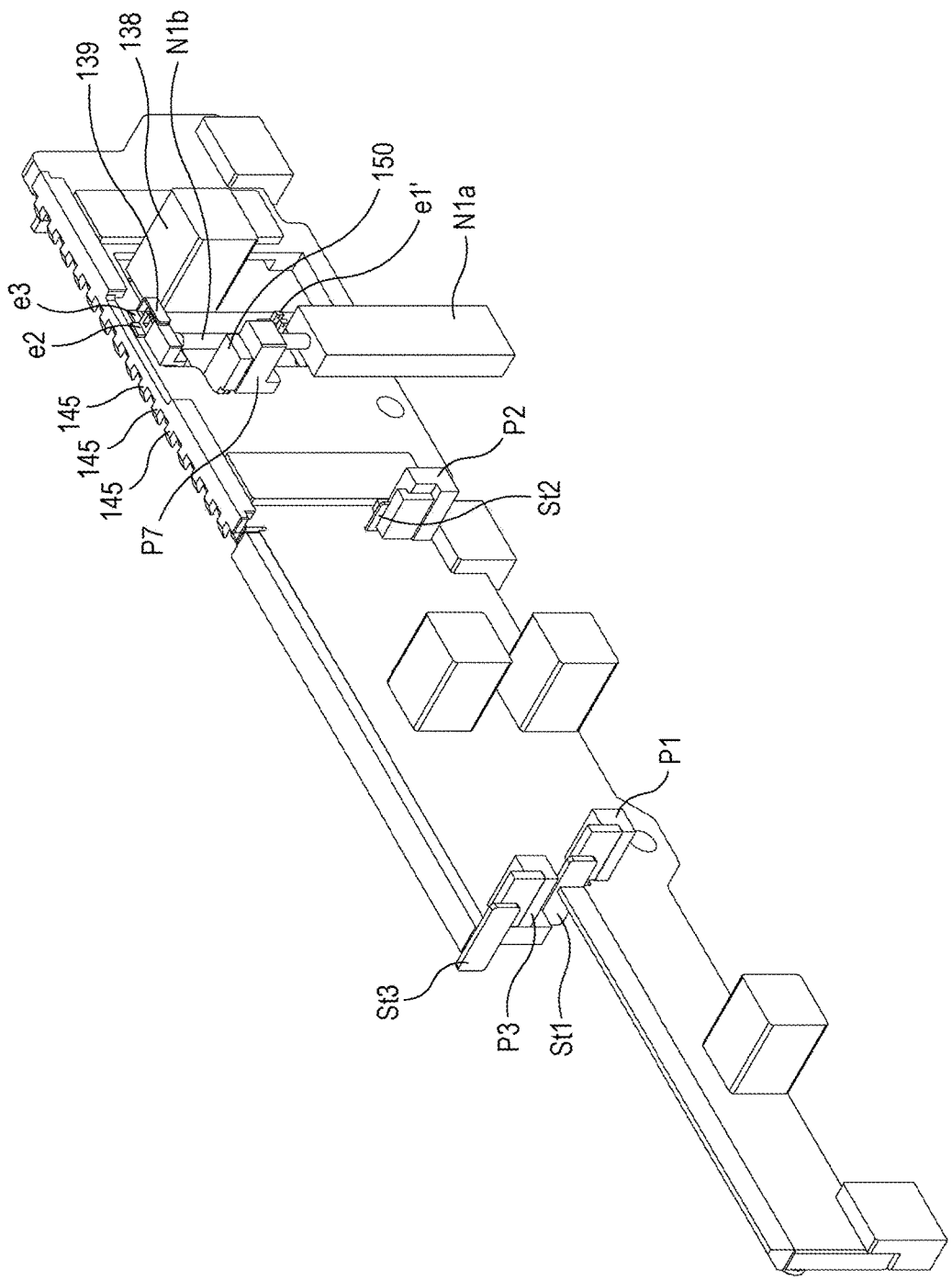

FIG. 15 is a perspective view of the transfer apparatuses 100A' and 100B' shown in FIG. 14. FIGS. 16 and 17 are perspective views of one transfer apparatus 100A' shown in FIG. 15. Referring to FIGS. 15 to 17, the inspection apparatus 1' includes a transfer apparatus 100' supported on a frame 60. A pair of transfer apparatuses 100A' and 100B' may be configured to support the left and right end portions of the object B. Hereinafter, the description of the transfer apparatus 100' may be understood as a description of each of the transfer apparatuses 100A' and 100B'.

The transfer apparatus 100' may include movers 110L and 110H configured to move the transferred article in the front-rear direction. The movers 110L and 110H may include a lower mover 110L and an upper mover 110H spaced apart from each other in the up-down direction. For example, each of the lower mover 110L and the upper mover 110H may include a transfer belt. In the present embodiment, the lower mover 110L includes first movers 111 and 112, and the upper mover 110H includes a second mover 113.

The transfer apparatus 100' includes movers 111, 112 and 113 disposed in front of the support part 131. The transfer apparatus 100' includes first movers 111 and 112 and a second mover 113 disposed in front of the support part 131. The first movers 111 and 112 are configured to move the transferred article in the rear direction while supporting the transferred article. The second mover 113 is configured to move the transferred article in the front direction while supporting the transferred article.

The second mover 113 is disposed above or below the first movers 111 and 112. In the present embodiment, the second mover 113 is disposed above the first movers 111 and 112. In another embodiment, the second mover 113 may be disposed below the first movers 111 and 112.

The first movers 111 and 112 are configured to move the transferred article in the rear direction so that the support part 131 can support the transferred article. The support part 131 is configured to move the transferred article in the front direction so that the second mover 113 can support the transferred article.

The first movers 111 and 112 may include transfer belts 111 and 112. The first movers 111 and 112 may include a plurality of transfer belts 111 and 112 arranged in the front-rear direction. The second mover 113 may include a transfer belt 113.

In the second embodiment, the upper end engaging portion 145 may make contact with the upper surface of the object B, which is the transferred article, the support part 131 may support the lower surface of the object B, and the side guide 135 may make contact with the side end of the object B. The lower end stopper 142' of the inspection apparatus 1' is disposed to be spaced downward from a variable stopper 150.

The inspection apparatus 1' includes a motor M1 configured to provide a driving force to the mover 111 and a motor M2 configured to provide a driving force to the mover 112. The inspection apparatus 1' includes a motor M4 configured to provide a driving force to the mover 113.

The transfer apparatus 100' may include a plurality of lifting sensors e1', e2 and e3 fixed to the support frame 141 to detect a plurality of set positions of the lift 130. The lift 130 may include a lifting target 139 which is detected by one of the lifting sensors e1', e2 and e3 when the lift 130 is located at one of the set positions. In a state in which the lift 130 has moved to a preset upper limit position, the lifting sensor e2 detects the lifting target 139 so that the control part can recognize that the lift 130 has moved to the preset upper limit position. In a state in which the lift 130 has moved to a preset lower limit position, the lifting sensor e1' detects the lifting target 139 so that the control part can recognize that the lift 130 has moved to the preset lower limit position. In a state in which the lift 130 has moved to a preset predetermined position (a position between the upper limit position and the lower limit position), the lifting sensor e3 detects the lifting target 139 so that the control part can recognize that the lift 130 has moved to the preset predetermined position. The predetermined position may be set to a position at which the upper surface of the mover 113 and the upper surface of the support part 131 are at the same level so that the transferred article can move from one of the mover 113 and the support part 131 to the other.

The transfer apparatus 100' includes a variable stopper 150 configured to set the predetermined position of the lift 130. The variable stopper 150 may be moved in a stopping direction G1 perpendicular to the up-down direction and the front-rear direction (refer to FIG. 22). The variable stopper 150 may be moved in a releasing direction G2 opposite to the stopping direction G1 (see FIG. 24). The variable stopper 150 is configured to move in the stopping direction G1 so that variable stopper 150 comes into contact with the lower surface of the lift 130 when the lift 130 is moved downward. The variable stopper 150 is configured to move in the releasing direction G2 so that the lift 130 is not stopped by the variable stopper 150 when the lift 130 is moved downward. The variable stopper 150 is configured to ensure that when the lower surface of the lift 130 is in contact with the variable stopper 150, the upper surface of the upper one (113) of the first movers 111 and 112 and the second mover 113 is located at the same height as the upper surface of the support part 131. When the lift 130 is moved downward from the upper limit position, the lift 130 may make contact with the variable stopper 150. The inspection apparatus 1' includes a driver P7 such as a pneumatic cylinder or the like configured to provide a driving force for moving the variable stopper 150.

In the second embodiment, the belt 181 and the pulleys 185 and 186 are rotated by the rotation of the motor M5, and the lead screws 188 and 189 are rotated by the rotation of the pulleys 185 and 186. When the lead screws 188 and 189 are rotated, one transfer apparatus 100B' is moved in the left-right direction along the lead screws 188 and 189.

The inspection apparatus 1' may include at least one sensor Se1, Se2, Se3, Se4, Se7 or Se8 configured to detect the object B when the object B is located at a predetermined position. The sensing direction of the sensor Se1, Se2, Se3, Se4, Se7 or Se8 may be an upward direction.

The inspection apparatus 1' includes a sensor Se1 configured to detect the transferred article when the transferred article is located at a maximum forward movement position on the first mover 111. The control part may determine whether to perform a rearward movement operation of the transferred article, based on the detection result of the sensor Se1.

The inspection apparatus 1' includes a sensor Se2 configured to detect the transferred article when the transferred article comes into contact with the front portion of the stopper St1. The control part may recognize that the transferred article is ready to move from the first mover 111 to the first mover 112, based on the detection result of the sensor Se2.

The inspection apparatus 1' includes a sensor Se3 configured to detect the transferred article when the transferred article is located across the front-rear direction boundary between the first mover 111 and the first mover 112. The control part may recognize whether the transferred article straddles the first mover 111 and the first mover 112, based on the detection result of the sensor Se3.

The inspection apparatus 1' includes a sensor Se4 configured to detect the transferred article when the transferred article comes into contact with the front portion of the stopper St2. The control part may recognize that the transferred article is ready to move from the first mover 112 to the front-rear direction mover (support part), based on the detection result of the sensor Se4.

The inspection apparatus 1' includes a sensor Se7 configured to detect the transferred article when the transferred article is located across the front-rear direction boundary between front-rear direction mover (support part) and the second mover 113. The control part may recognize whether the transferred article straddles the support part 131 and the second mover 113, based on the detection result of the sensor Se7.

The inspection apparatus 1' includes a sensor Se8 configured to detect the transferred article before the transferred article comes into contact with the stopper St3 when the transferred article is moved from the rear side to the front side on the second mover 113. The control part may reduce the forward movement speed of the transferred article before the transferred article comes into contact with the stopper St3, based on the detection result of the sensor Se8. The sensor Se8 may detect the transferred article when the transferred article is located at a maximum forward movement position on the second mover 113.

The inspection apparatus 1' includes a stopper St3 configured to limit the maximum forward movement position of the transferred article. The stopper St3 is configured to make contact with the front end of the transferred article when the transferred article is moved in the front direction by the second mover 113. The stopper St3 is supported by the transfer apparatus 100'. The stopper St3 may be moved in a stopping direction G1 and the releasing direction G2 by a stopper driver P3 such as a pneumatic cylinder or the like. In a state in which the stopper St3 has been moved in the releasing direction G2, the transferred article may be removed from the transfer apparatus 100'.

The inspection apparatus 1' includes a stopper St1 disposed at a front-rear direction boundary between the first mover 111 and the first mover 112. The rear end of the transferred article may make contact with the front surface of the stopper St1. The stopper St1 may be moved in a stopping direction G1 and a releasing direction G2 by a stopper driver P1 such as a pneumatic cylinder or the like. In a state in which the stopper St1 has moved in the releasing direction G2, the stopper St1 may deviates laterally from the movement path of the transferred article so that the transferred article can be moved in the rear direction without the interference of the stopper St1.

The inspection apparatus 1' includes a stopper St2 arranged at a front-rear direction boundary between the first mover 112 and the support part 131. The rear end of the transferred article may make contact with the front surface of the stopper St2. The stopper St2 may be moved in a stopping direction G1 and a releasing direction G2 by a stopper driver P2 such as a pneumatic cylinder or the like. In a state in which the stopper St2 has moved in the releasing direction G2, the stopper St2 may deviate laterally from the movement path of the transferred article so that the transferred article can be moved in the rear direction without the interference of the stopper St2.

The transfer apparatus 100' may include transfer guides 147a and 147b configured to guide the movement direction of the transferred article. The transfer guides 147a and 147b may be fixed to the upper end of the support frame 141.

The transfer apparatus 100' includes a first transfer guide 147a corresponding to the first mover 111. The first transfer guide 147a may include an inclined surface (not shown) configured to guide the object B so as to be seated on the first mover 111. The first mover 111 may include a side guide portion (not shown) having a surface facing the left end or right end of the transferred article.

The transfer apparatus 100' may include a second transfer guide 147b corresponding to the second mover 113. The second transfer guide 147b may include a side end guide portion (not shown) having a surface facing the left end or right end of the transferred article. The second transfer guide 147b may include an upper end guide portion (not shown) having a surface facing the upper surface of the transferred article. The upper end guide portion may be connected to the upper end of the side end guide portion.

Figure 19:
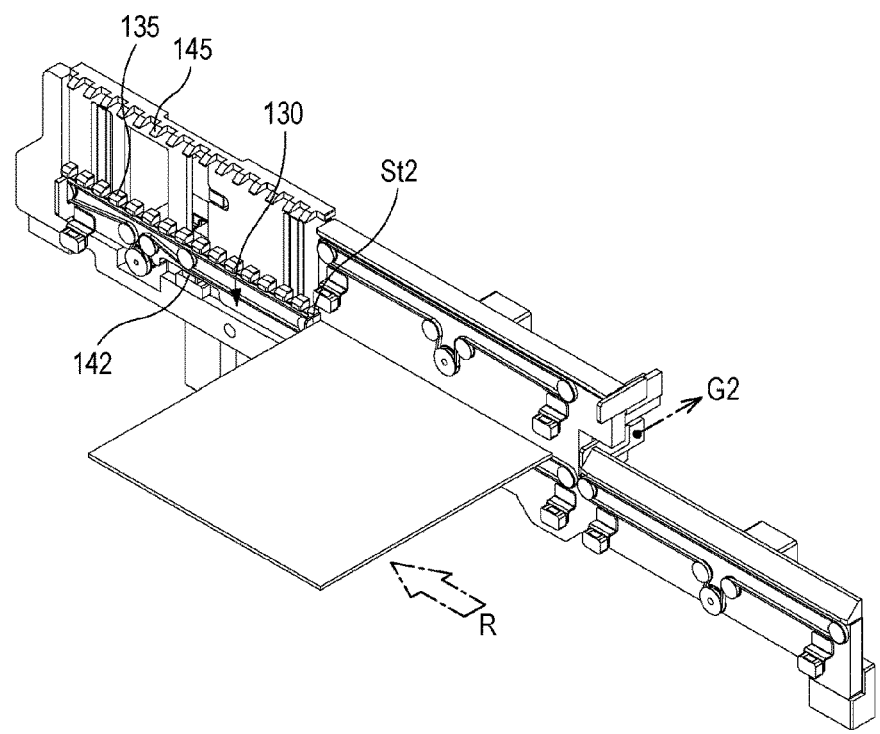
Figure 20:
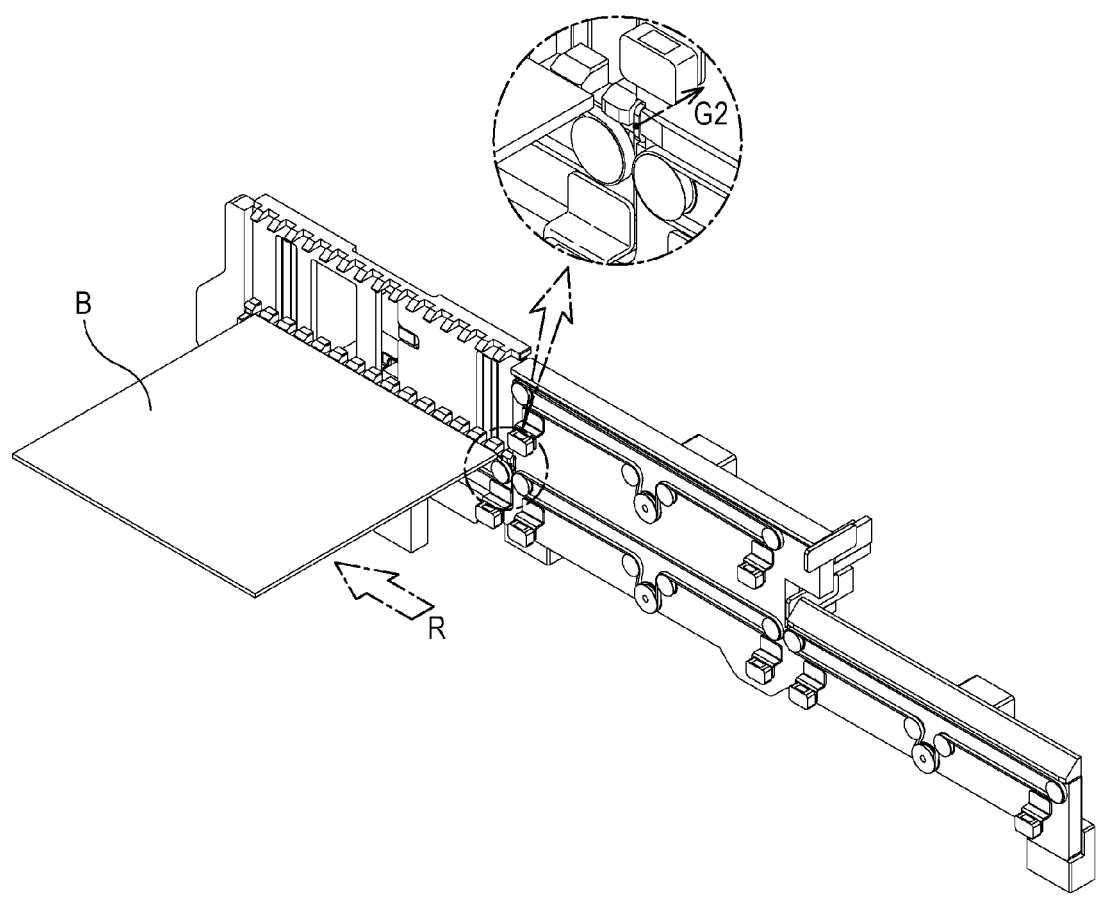
Figure 21:
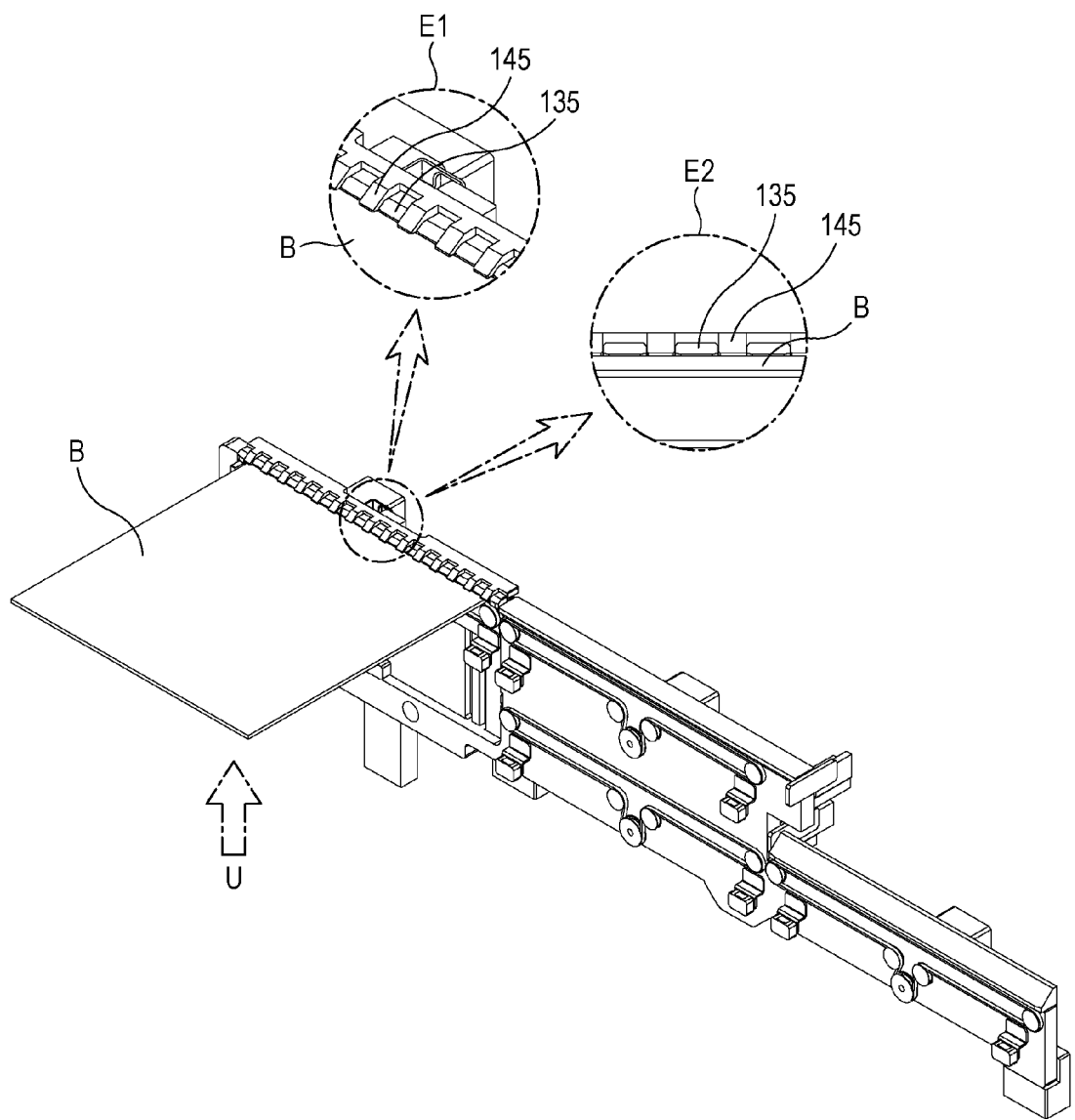
Figure 22:
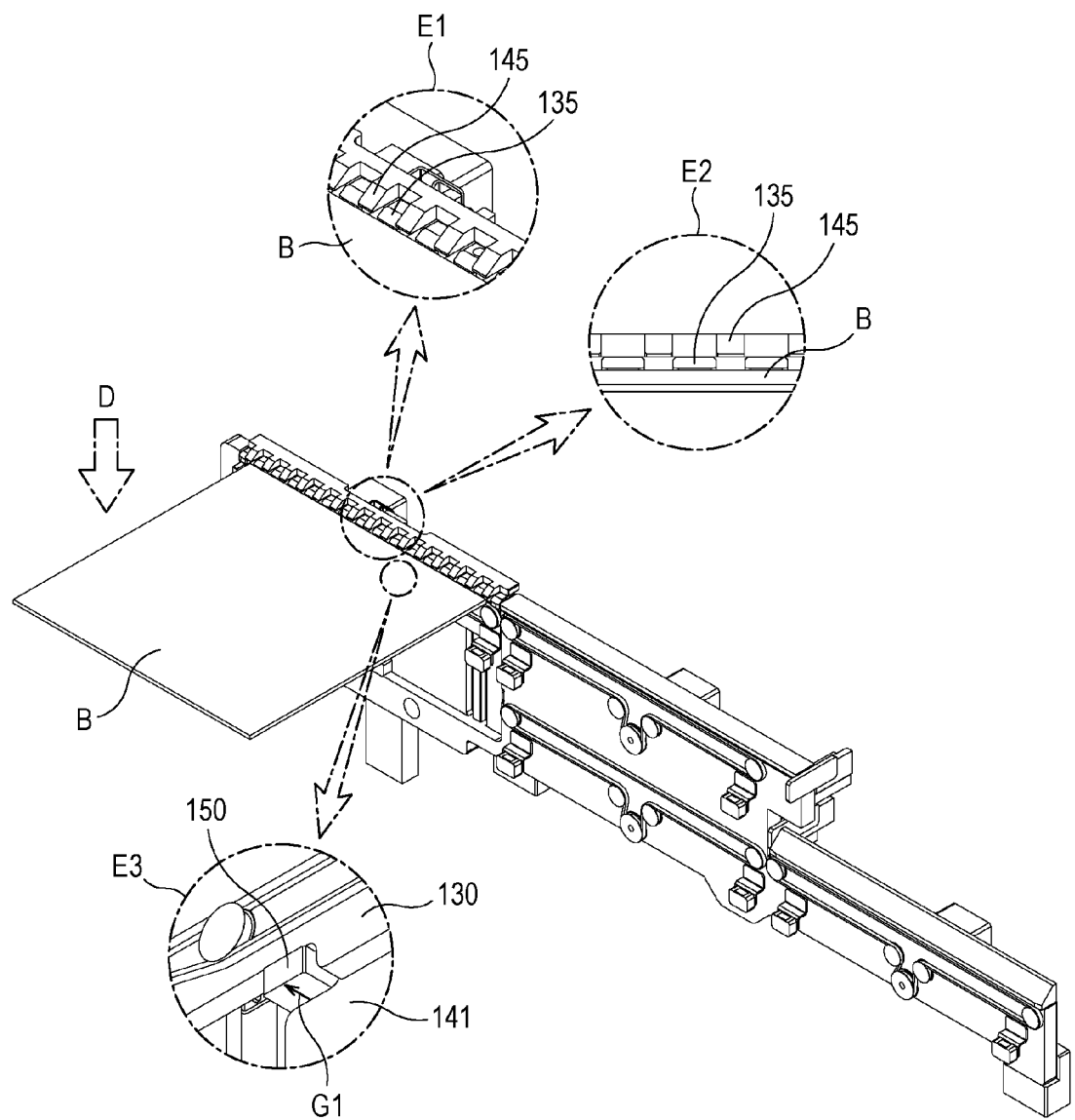
Figure 23:
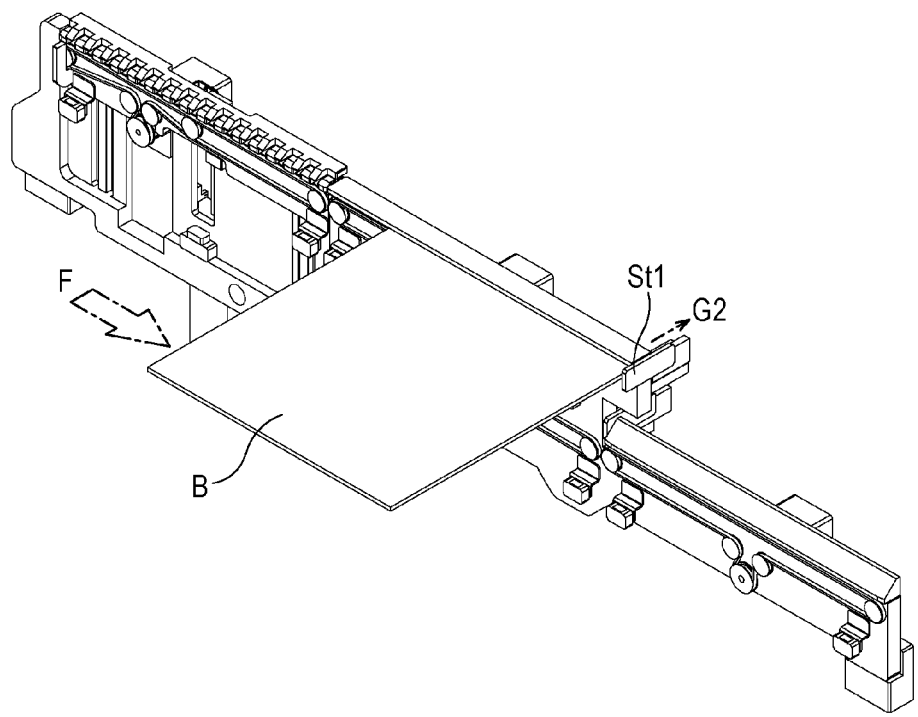
Figure 24:
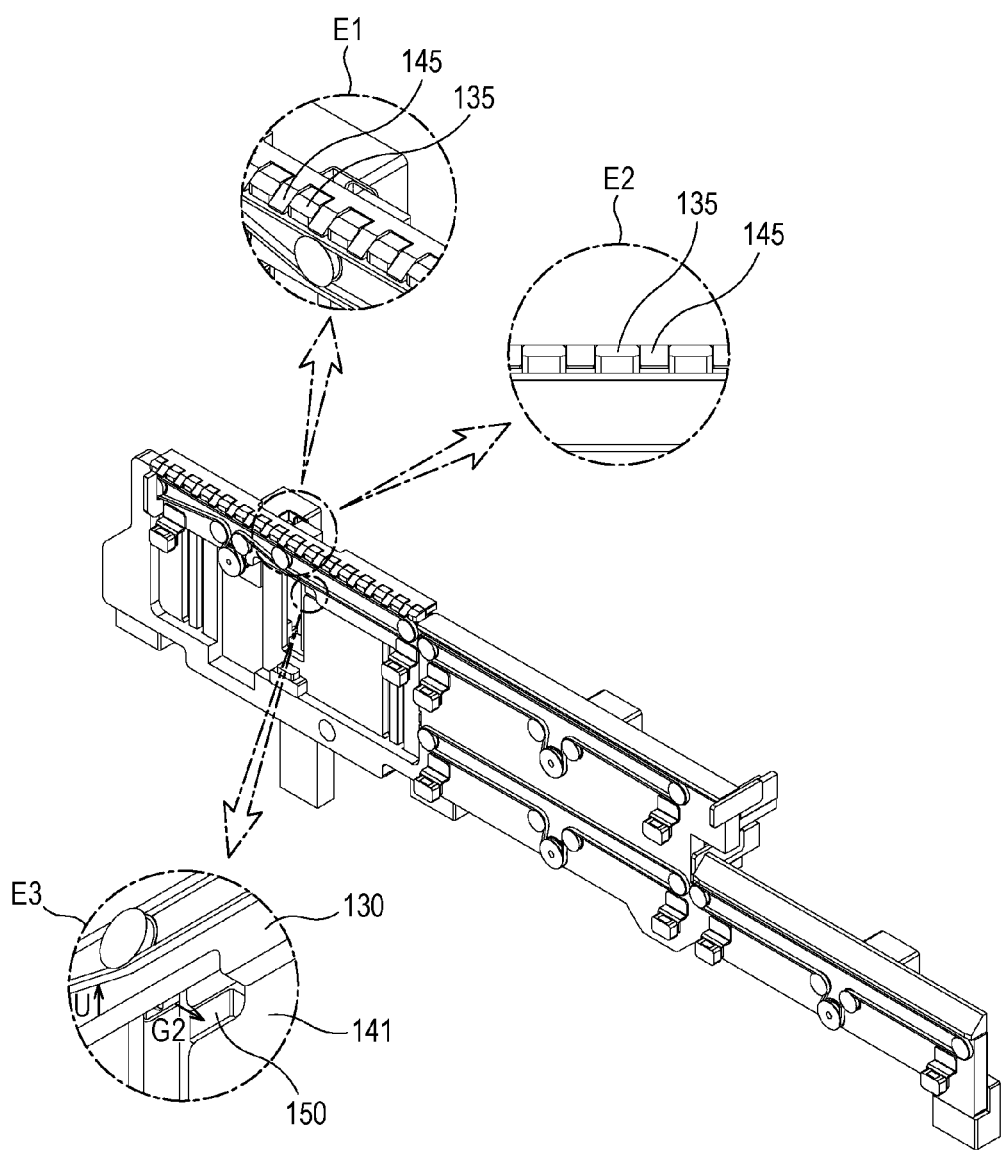

FIGS. 18 to 24 are perspective views illustrating the operations of the apparatus during an inspection process of one cycle based on one (100A') of the transfer apparatuses 100A' and 100B' shown in FIG. 15. FIGS. 21, 22 and 24 show a partially enlarged perspective view E1 and a partial elevation view E2 viewed from the right side. In addition, FIGS. 22 and 24 show a perspective view E3 of a portion on which the variable stopper 150 is disposed, as viewed at another angle. Referring to FIGS. 18 to 24, the object inspection method and the operations of the apparatus in individual steps (see FIG. 25) will be described as follows. The above description of the first embodiment may be applied to the contents not described below with respect to the second embodiment.

Figure 18:
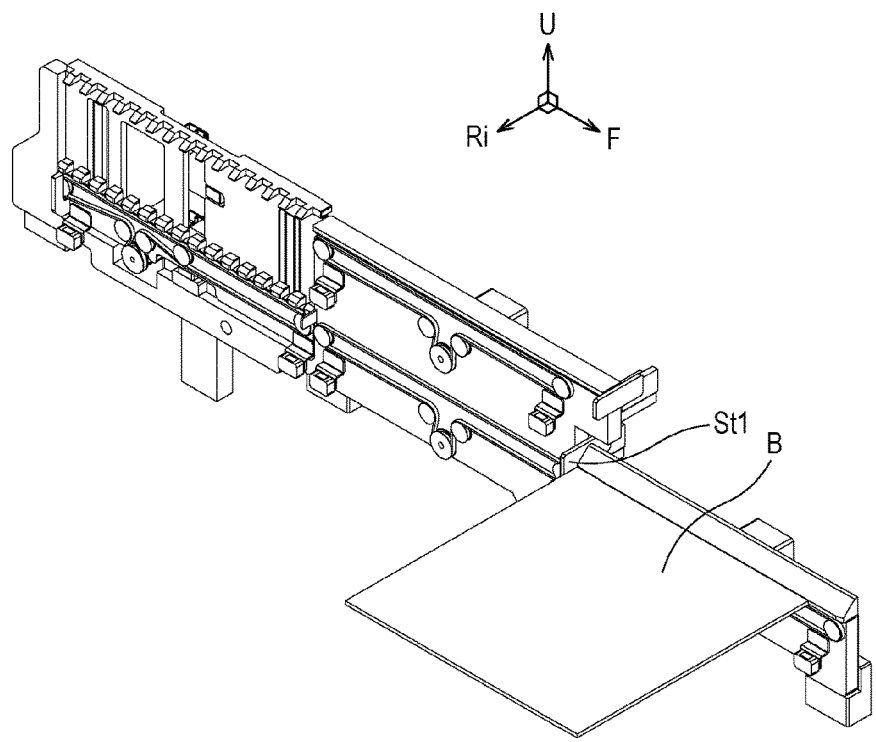
FIGS. 18 to 24 are perspective views illustrating the operation of the apparatus during an inspection process of one cycle based on one (100A') of the transfer apparatuses 100A' and 100B' shown in FIG. 15.

Referring to FIG. 18, the object inspection method may include a loading step S1 of seating the object B on the transfer apparatus 100'. In the loading step S1, the object B may be seated on the transfer apparatus 100' by an operator or a machine. When the control part receives an input signal from the start input part 31 after the object B is seated on the first mover 111, the following processes may be performed.

Referring to FIGS. 18 to 20, the object inspection method may include a rearward movement step S2 of moving the object B in the rear direction R. Referring to FIG. 18, as the first mover 111 operates, the transferred article placed on the first mover 111 is moved rearward R and is stopped by the stopper St1. Thereafter, the stopper St1 is moved in the releasing direction G2. Referring to FIG. 19, as the first mover 112 operates, the transferred article transferred from the first mover 111 to the first mover 112 is moved in the rear direction R and is stopped by the stopper St2. Referring to FIG. 20, before the stopper St2 is moved in the releasing direction G2, the lift 130 completes the movement to the lower limit position so that the support part 131 and the first mover 112 are at the same level. Thereafter, the stopper St2 is moved in the releasing direction G2. The transferred article is moved in the rear direction R and is placed on the support part 131. At this time, the object B comes into contact with the rear end stopper 136.

Referring to FIG. 21, the object inspection method includes an upward movement step S3 of moving the object B upward U. In the second embodiment, the lift 130 is moved upward so that the upper end of the object B comes into contact with the lower surface of the upper end engaging portion 145. Thereafter, the inspection step S4 proceeds.

Referring to FIG. 22, the object inspection method includes a downward movement step S5 of moving the object B downward D after the inspection step S4. In the downward movement step S5, before the transferred article is moved downward, the variable stopper 150 is moved in the stopping direction G1. In the downward movement step S5, the lift 130 is moved downward so that the upper surface of the support part 131 is at the same level as the upper surface of the second mover 113. The lift 130 is moved downward to make contact with the upper surface of the variable stopper 150.

Referring to FIG. 23, the object inspection method may include a forward movement step S6 of moving the object B in the front direction F. At this time, the transferred article is moved from the support part 131 to the second mover 113. The transferred article is moved in the front direction and is stopped by the stopper St1. In this state, the stopper St1 is moved in the releasing direction G2 so that the operator can take out the object B from the transfer apparatus 100'.

Referring to FIG. 24, the object inspection method may include a step of causing the lift 130 and the variable stopper 150 to be spaced apart from each other in the up-down direction by moving the lift 130 upward after the object B is moved from the support part 131 to the second mover 113. The object inspection method may include a step of moving the variable stopper 150 in the releasing direction G2 after the lift 130 and the variable stopper St150 are spaced apart from each other in the up-down direction. The object inspection method may include a step of moving the lift 130 downward to so as to make contact with the lower end stopper 142' after the variable stopper 150 has moved in the releasing direction G2. At this time, the upper surface of the support part 131 and the upper surface of the first mover 112 are at the same level.

Figure 25:
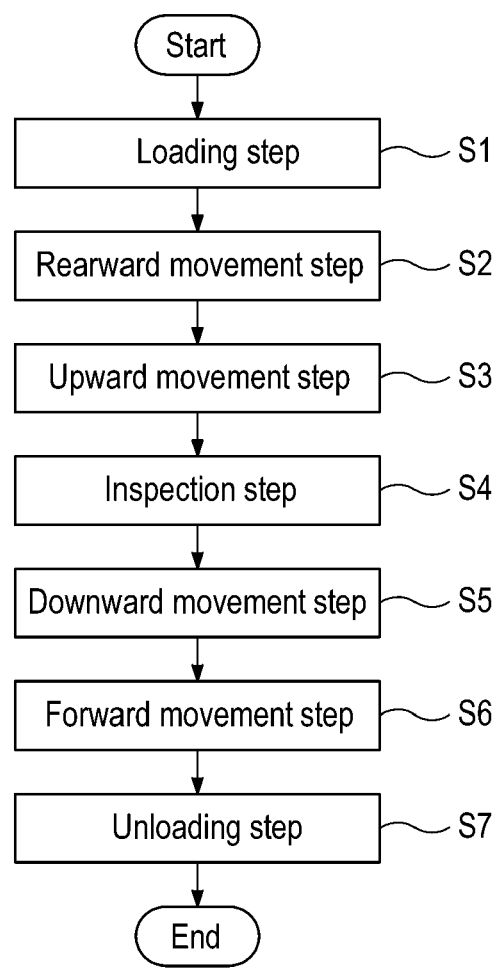
FIG. 25 is a flowchart of an object inspection method according to one embodiment of the present disclosure.

Referring to FIG. 25, the object inspection method may include a loading step S1 of seating the object B on the jig J or the transfer apparatus 100'. The object inspection method may include a rearward movement step S2 of moving transferred article in the rear direction by the support part 131. The object inspection method includes an upward movement step S3 of moving the lift 130 upward to move the transferred article upward so that the upper surface of the transferred article comes into contact with the upper end engaging portion 145. The object inspection method includes an inspection step S4 of inspecting the object B to determine whether the object B is defective. The object inspection method includes a downward movement step S5 of moving the lift 130 downward to move the transferred article downward so that the upper surface of the transferred article is spaced apart from the upper end engaging portion 145. The object inspection method may include a forward movement step S6 of moving the transferred article in the front direction by the support part 131. The object inspection method may include an unloading step S7 of removing the object B from the jig J or the transfer apparatus 100'.

While the foregoing methods have been described with respect to particular embodiments, these methods may also be implemented as computer-readable codes on a computer-readable recording medium. The computer-readable recoding medium includes any kind of data storage devices that can be read by a computer system. Examples of the computer-readable recording medium includes ROM, RAM, CD-ROM, magnetic tape, floppy disk, optical data storage device and the like. Also, the computer-readable recoding medium can be distributed to the computer systems which are connected through a network so that the computer-readable codes can be stored and executed in a distribution manner. Further, the functional programs, codes and code segments for implementing the foregoing embodiments can easily be inferred by programmers in the art to which the present disclosure pertains.

Although the technical spirit of the present disclosure has been described by the examples described in some embodiments and illustrated in the accompanying drawings, it should be noted that various substitutions, modifications, and changes can be made without departing from the scope of the present disclosure which can be understood by those skilled in the art to which the present disclosure pertains. In addition, it should be noted that that such substitutions, modifications and changes are intended to fall within the scope of the appended claims.

What is claimed is:

1. A transfer apparatus for an inspection apparatus, comprising:
    an upper end engaging portion configured to make contact with an upper surface of a transferred article including an inspection object;
    a support frame to which the upper end engaging portion is fixed;
    a lift including a support part configured to support a lower surface of the transferred article, the lift arranged on the support frame to be movable in an up-down direction; and
    a lifting driver configured to provide a driving force to move the lift in the up-down direction,
    wherein the lift includes a side guide configured to make contact with a left surface or a right surface of the transferred article,
    the upper end engaging portion includes a plurality of lower surfaces arranged to form a plurality of gaps in a front-rear direction and configured to make contact with the upper surface of the transferred article, and
    the side guide includes a plurality of side guide protrusions protruding upward to be inserted into the plurality of gaps and configured to make contact with the left surface or the right surface of the transferred article.

2. The transfer apparatus of claim 1, wherein the support part is configured to move the transferred article in a front-rear direction while supporting the lower surface of the transferred article.

3. The transfer apparatus of claim 2, wherein the lift includes a transfer pulley and a motor configured to provide a driving force for rotating the transfer pulley, and the support part includes a transfer belt wound around the transfer pulley to be rotatable and configured to support the lower surface of the transferred article.

4. The transfer apparatus of claim 2, wherein the lift includes a rear end stopper configured to make contact with a rear surface of the transferred article to set a maximum rearward movement position of the transferred article.

5. The transfer apparatus of claim 2, further comprising:
a mover arranged in front of the support part and configured to move the transferred article in a rear direction while supporting the transferred article,
wherein the mover is configured to move the transferred article in the rear direction so that the support part supports the transferred article.

6. The transfer apparatus of claim 5, wherein the support part is configured to move the transferred article in a front direction so that the mover supports the transferred article.

7. The transfer apparatus of claim 2, further comprising:
a first mover arranged in front of the support part and configured to move the transferred article in a rear direction while supporting the transferred article; and
a second mover arranged above or below the first mover and in front of the support part and configured to move the transferred article in a front direction while supporting the transferred article,
wherein the first mover is configured to move the transferred article in the rear direction so that the support part supports the transferred article, and
the support part is configured to move the transferred article in the front direction so that the second mover supports the transferred article.

8. The transfer apparatus of claim 7, further comprising a variable stopper configured to move in a stopping direction perpendicular to the up-down direction and the front-rear direction to make contact with a lower surface of the lift when the lift moves downward and configured to move in a releasing direction opposite to the stopping direction so as not to stop the lift when the lift moves downward,
wherein the variable stopper is configured such that, when the lower surface of the lift is in contact with the variable stopper, an upper surface of an upper one of the first mover and the second mover is located at the same height as an upper surface of the support part.

9. The transfer apparatus of claim 1, wherein the upper surface of the transferred article comes into contact with the upper end engaging portion when the lift is moved upward, and the upper surface of the transferred article is spaced apart from the upper end engaging portion when the lift is moved downward.

10. The transfer apparatus of claim 1, wherein the upper end engaging portion is configured to make contact with an upper surface of one side portion, which is one of a left side portion and a right side portion of the transferred article,
the support part is configured to support a lower surface of the one side portion, and
the side guide is configured to make contact with an end of the transferred article on a side on which the one side portion is disposed with respect to a center of the transferred article.

11. The transfer apparatus of claim 1, wherein the upper end engaging portion includes a plurality of upper end engaging protrusions protruding in a direction in which the side guide faces the transferred article and forming the plurality of lower surfaces.

12. The transfer apparatus of claim 1, further comprising a lower end stopper configured to make contact with a lower surface of the lift to set a maximum downward movement position of the lift.

13. The transfer apparatus of claim 1, further comprising a plurality of lifting sensors fixed to the support frame to detect a plurality of set positions of the lift,
wherein the lift includes a lifting target detected by one of the plurality of lifting sensors when the lift is located at one of the plurality of set positions.

14. An inspection apparatus comprising at least one transfer apparatus of claim 1.

15. The inspection apparatus of claim 14, wherein the at least one transfer apparatus includes:
a first transfer apparatus configured to support a left side portion of the transferred article, and
a second transfer apparatus configured to support a right side portion of the transferred article.

16. The inspection apparatus of claim 15, further comprising:
a frame guide configured to guide left-right movement of at least one of the first transfer apparatus and the second transfer apparatus; and
a driver configured to provide a driving force for moving the at least one of the first transfer apparatus and the second transfer apparatus in a left-right direction.

17. An object inspection method using an inspection apparatus including the transfer apparatus of claim 1, the method comprising:
moving the transferred article upward by moving the lift upward and contacting the upper surface of the transferred article with the upper end engaging portion;
inspecting the inspection object to determine whether the inspection object is defective; and
moving the transferred article downward by moving the lift downward and spacing apart the upper surface of the transferred article from the upper end engaging portion.

18. The method of claim 17, further comprising:
moving the transferred article in a rear direction by the support part before the moving the transferred article upward; and
moving the transferred article in a front direction by the support part after the moving the transferred article downward.

* * * * *